(12) United States Patent
Tustaniwskyj et al.

(10) Patent No.: US 6,522,156 B2
(45) Date of Patent: *Feb. 18, 2003

(54) PLANAR SUBASSEMBLY FOR TESTING IC CHIPS HAVING FACES WITH PRESSED ELECTRICAL CONTACTS THAT CARRY ALL POWER AND SIGNALS FOR THE CHIPS

(75) Inventors: Jerry Ihor Tustaniwskyj, Mission Viejo, CA (US); Lawrence William Friedrich, Escondido, CA (US)

(73) Assignee: Unisys Corporation, Blue Bell, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/511,790

(22) Filed: Feb. 23, 2000

(65) Prior Publication Data

US 2002/0109519 A1 Aug. 15, 2002

(51) Int. Cl.[7] .................. G01R 31/26; G01R 31/02
(52) U.S. Cl. ................... 324/754; 324/765; 324/760
(58) Field of Search ................... 324/765, 760, 324/158.1, 754

(56) References Cited

U.S. PATENT DOCUMENTS

| | | | | |
|---|---|---|---|---|
| 5,075,821 A | * | 12/1991 | McDonnal | 361/386 |
| 5,497,079 A | * | 3/1996 | Yamada et al. | 324/158.1 |
| 5,570,032 A | * | 10/1996 | Atkins et al. | 324/760 |
| 5,828,223 A | * | 10/1998 | Rabkin et al. | 324/754 |
| 6,108,208 A | * | 8/2000 | Tustaniwskyj et al. | 361/705 |

* cited by examiner

Primary Examiner—Kamand Cuneo
Assistant Examiner—Paresh Patel
(74) Attorney, Agent, or Firm—Charles J. Fassbender; Mark T. Starr; Lise A. Rode

(57) ABSTRACT

An electromechanical apparatus for testing IC chips includes a chip holding subassembly, a power converter subassembly, and a temperature regulating subassembly which are squeezed together in multiple sets by respective pressing mechanisms; and this apparatus uses a generic structure for both the chip holding subassembly and the power converter subassembly. This generic structure is comprised of a planer substrate having first and second faces that are opposite to each other and are surrounded by an edge that is free of any electrical edge connectors. To use the above generic subassembly as the chip holding subassembly, an electrical components on the first face of the substrate include sockets which hold the chips that are tested. To use the above generic subassembly as the power converter subassembly, the electrical components on the first face of the substrate include electrical power converters for the chips that are tested.

9 Claims, 18 Drawing Sheets

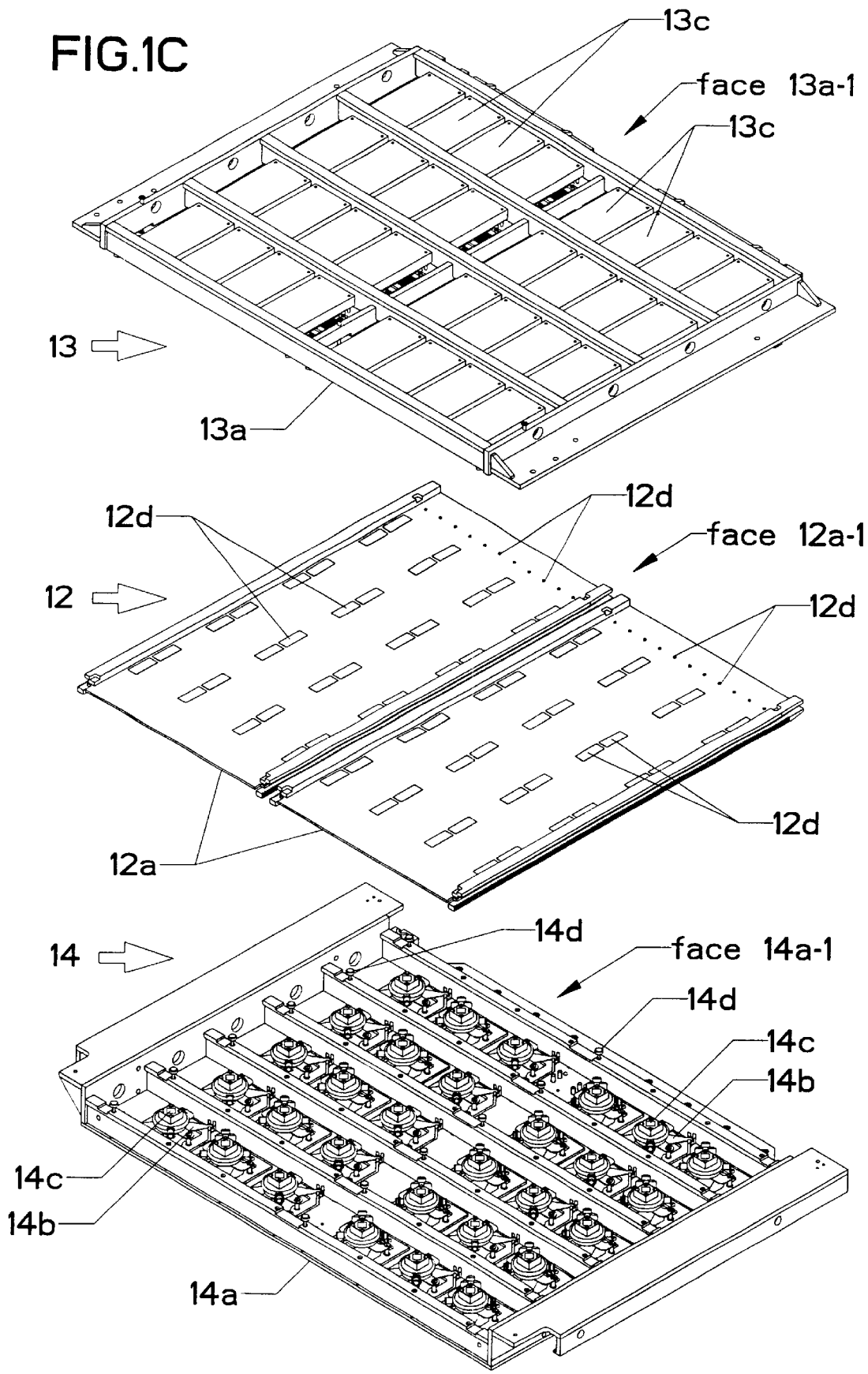

FIG. 5

EQ 1 ............ $k = \dfrac{Fx(B2) - Fx(B1)}{\Delta x}$

EQ 2 ........... $\Delta x = 2L[\sin(B2) - \sin(B1)]$

EQ 3 .......... $k = \dfrac{Fx(B2) - Fx(B1)}{2L[\sin(B2) - \sin(B1)]}$

EQ 4 .......... $Fy = 2Fa[\cos(B)]$

EQ 5 .......... $Fx = Fa[\sin(B)]$

EQ 6 .......... $\dfrac{Fy}{Fx} = \dfrac{2}{\tan(B)}$

EQ 7 .......... $Fx = \tfrac{1}{2}\tan(B) Fy$

EQ 8 .......... $Fx(B1) = \tfrac{1}{2}\tan(B1) Fy(B1)$

EQ 9 .......... $Fx(B2) = \tfrac{1}{2}\tan(B2) Fy(B2)$

EQ 10 ........ $k = \dfrac{\tan(B2) Fy(B2) - \tan(B1) Fy(B1)}{4L[\sin(B2) - \sin(B1)]}$ EQ 11 ........ $\Delta Y = L\cos(B1) - L\cos(B2)$ EQ 12 ........ $L = \dfrac{\Delta Y}{\cos(B1) - \cos(B2)}$ EQ 13 ........ $k = \dfrac{[\tan(B2) Fy(B2) - \tan(B1) Fy(B1)][\cos(B1) - \cos(B2)]}{4[\sin(B2) - \sin(B1)]\Delta Y}$ EQ 14 ........ set $Fy(B1) = Fy(B2) = Fy(\min)$ EQ 15 ........ $k = [Fy(\min)]\dfrac{[\tan(B2) - \tan(B1)][\cos(B1) - \cos(B2)]}{4\Delta Y[\sin(B2) - \sin(B1)]}$

FIG. 6

S1→ Select Fy (MIN) and ΔY in eq. 15 as design constraints

S2→ Choose B1, B2 in eq. 15 such that Fx < Fy from eq. 8 and 9

S3→ Calc. k from equation 15

S4→ Calc. L from equation 12

S5→ Fx (B1) = k Δ xo = 1/2 Tan (B1) Fy (MIN)

FIG. 7

S1→ Fy(MIN) = 60 pounds, Δy = 0.20 inches

S2→ B1 = 20 degrees, B2 = 29 degrees

S3→ k = 6.45 pounds per inch

S4→ L = 3.1 inches

S5→ Δxo = 1.693 inches

FIG. 8

| B | Fx | Fy | Fy/Fx |
|---|---|---|---|
| 16 | 8.26 | 57.64 | 6.97 |
| 17 | 8.93 | 58.44 | 6.54 |
| 18 | 9.60 | 59.09 | 6.16 |
| 19 | 10.26 | 59.60 | 5.81 |
| 20 (B1) | 10.92 | 60.00 | 5.49 |
| 21 | 11.57 | 60.30 | 5.21 |
| 22 | 12.22 | 60.50 | 4.95 |
| 23 | 12.87 | 60.63 | 4.71 |
| 24 | 13.51 | 60.68 | 4.49 |
| 25 | 14.14 | 60.66 | 4.29 |
| 26 | 14.77 | 60.57 | 4.10 |
| 27 | 15.40 | 60.44 | 3.93 |
| 28 | 16.02 | 60.24 | 3.76 |
| 29 (B2) | 16.63 | 60.00 | 3.61 |
| 30 | 17.24 | 59.71 | 3.46 |
| 31 | 17.84 | 59.38 | 3.33 |
| 32 | 18.43 | 59.00 | 3.20 |

$$\text{Eq15'} \rightarrow k = \frac{F_{ymin}}{\triangle y} \cdot \frac{\left(\frac{\tan(B2a)\cdot\tan(B2b)}{\tan(B2a)+\tan(B2b)}\right) - \left(\frac{\tan(B1a)\cdot\tan(B1b)}{\tan(B1a)+\tan(B1b)}\right)}{\left(\frac{\sin(B2a)-\sin(B1a)}{\cos(B1a)-\cos(B2a)}\right) + \left(\frac{\sin(B2b)-\sin(B1b)}{\cos(B1b)-\cos(B2b)}\right)}$$

FIG. 14A

EQ 21 ........ $k = \dfrac{F_{xa} - F_{xb}}{\Delta x}$

EQ 22 ........ $\Delta x = L1 \sin(Da) - L1 \sin(Db)$

EQ 23 ........ $k = \dfrac{F_{xa} - F_{xb}}{L1 [\sin(Da) - \sin(Db)]}$

EQ 24 ........ $F2x = F2 \sin(E)$; where F2=Force along longitudinal axis of ARM 17b EQ 25 ........ $F2y = F2 \cos(E)$ EQ 26 ........ $\dfrac{F2x}{F2y} = \tan(E)$ EQ 27 ........ $F2x = F2y \tan(E)$ EQ 28 ........ Sum of forces on joint 17c in y direction = 0

EQ 29 ........ $F1y = F2y$; where F1=Force along longitudinal axis of ARM 17a

EQ 30 ........ $F1x = F1 \sin(D)$

EQ 31 ........ $F1y = F1 \cos(D)$

EQ 32 ........ $\dfrac{F1x}{F1y} = \tan(D)$

EQ 33 ........ $F1x = F1y \tan(D)$

EQ 34 ........ $F1x = F2y \tan(D)$

EQ 36 .......... $F_x = F_{2y} [\tan(D) - \tan(E)]$

EQ 37 ........ $F_{xa} = F_{2ya} [\tan(D_a) - \tan(E_a)]$

EQ 38 ........ $F_{xb} = F_{2yb} [\tan D_b) - \tan(E_b)]$

EQ 39 ........ $k = \dfrac{F_{2ya} [\tan(D_a) - \tan(E_a)] - F_{2yb} [\tan(D_b) - \tan(E_b)]}{L_1 [\sin(D_a) - \sin(D_b)]}$ EQ 40 ........ set $F_{2ya} = F_{2yb} = F_{2y}(\min)$ EQ 41 ........ $k = \dfrac{F_{2y}(\min) [\tan(D_a) + \tan(E_b) - \tan(E_a) - \tan(D_b)]}{L_1 [\sin(D_a) - \sin(D_b)]}$

FIG. 15

S11 → Select $F_{2y}(\min)$ and $\Delta Y$ as design constraints.

S12 → chose angles Ea and Da such that $F_{xa} < F_{2ya}$ in equation 37.

S13 → select L1 and L2 such that joints 17e and 17f couple to members 17e and 17g respectively.

S14 → calculate angle which arm 17a must rotate counterclockwise for joint 17f to move by $\Delta y$.

S15 → calculate angles Db and Eb.

S16 → calculate K from equation 41.

S17 → calculate $\Delta xo$ from $F_{xb} = K \Delta xo$

FIG. 16

S11→ Fymin = 60 pounds
Δy = 0.2 inches

S12→ Da = 29.077 degrees
Ea = 2.722 degrees

S13→ L1 = 3 inches
L2 = 4 inches

S14→ Da-Db = 9.077 degrees

S15→ Db = 20 degrees
Eb = -3.468 degrees

S16→ k = 11.66 pounds per inch

S17→ Δx0 = 2.184 inches

FIG. 17

| D | E | Fx | F2y | F2y/Fx |
|---|---|---|---|---|
| 15 | -7.059 | 22.56 | 57.59 | 2.55 |
| 16 | -6.331 | 23.15 | 58.21 | 2.51 |
| 17 | -5.608 | 23.74 | 58.77 | 2.48 |
| 18 | -4.890 | 24.32 | 59.25 | 2.44 |
| 19 | -4.176 | 24.90 | 59.66 | 2.40 |
| Db=20.000 | -3.468 | 25.47 | 60.00 | 2.36 |
| 21 | -2.764 | 26.05 | 60.27 | 2.31 |
| 22 | -2.066 | 26.61 | 60.47 | 2.27 |
| 23 | -1.372 | 27.18 | 60.61 | 2.23 |
| 24 | -0.685 | 27.74 | 60.67 | 2.19 |
| 25 | -0.002 | 28.29 | 60.67 | 2.14 |
| 26 | 0.675 | 28.85 | 60.61 | 2.10 |
| 27 | 1.346 | 29.39 | 60.47 | 2.06 |
| 28 | 2.012 | 29.93 | 60.28 | 2.01 |
| 29 | 2.671 | 30.47 | 60.02 | 1.97 |
| Da=29.077 | 2.722 | 30.51 | 60.00 | 1.95 |
| 30 | 3.325 | 31.00 | 59.70 | 1.93 |
| 31 | 3.973 | 31.53 | 59.33 | 1.88 |
| 32 | 4.614 | 32.05 | 58.90 | 1.84 |
| 33 | 5.249 | 32.56 | 58.41 | 1.79 |
| 34 | 5.877 | 33.07 | 57.86 | 1.75 |

PLANAR SUBASSEMBLY FOR TESTING IC CHIPS HAVING FACES WITH PRESSED ELECTRICAL CONTACTS THAT CARRY ALL POWER AND SIGNALS FOR THE CHIPS

RELATED CASES

The present invention, as identified by the above docket number and title, is related to three other inventions. Patent applications on all of these inventions were filed concurrently on Feb. 23, 2000; and they have one common Detailed Description. These three related inventions are identified as follows:
1. entitled "ELECTROMECHANICAL APPARATUS FOR TESTING IC CHIPS USING FIRST AND SECOND SETS OF SUBSTRATES WHICH ARE PRESSED TOGETHER" having U.S. Ser. No. 09/511,789;
2. entitled "SLIDING SPRINGY MECHANISM THAT OPENS AND CLOSES PRESSED ELECTRICAL CONTACTS WITH A FORCE WHICH IS NEARLY CONSTANT OVER A RANGE OF CLOSED POSITIONS" having U.S. Ser. No. 09/511,792;
3. entitled "PIVOTING SPRINGY MECHANISM THAT OPENS AND CLOSES PRESSED ELECTRICAL CONTACTS WITH A FORCE WHICH IS NEARLY CONSTANT OVER A RANGE OF CLOSED POSITIONS" having U.S. Ser. No. 09/511,791.

BACKGROUND OF THE INVENTION

The present invention relates to electromechanical apparatus for testing integrated circuit chips. More particularly, the present invention relates to chip testing apparatus in which a chip holding subassembly, a power converter subassembly, and a temperature regulating subassembly are squeezed together in multiple sets by respective pressing mechanisms which exert a substantially constant force despite several dimensional variations in the apparatus.

Typically, a single IC chip contains more than one-hundred-thousand transistors. Thus, a manufacturer of IC chips must test the chips to ensure that they operate properly before they are sold to a customer. This testing is usually accomplished as follows.

Initially, one group of chips that are to be tested are placed in respective sockets that are mounted on several printed circuit boards. Each printed circuit board has edge connectors on one edge of the board; and those connectors carry test signals, as well as DC electrical power, for the chips that are in the sockets.

After the chips are placed in the sockets, the printed circuit boards are inserted into fixed slots in an electromechanical apparatus where the chip testing occurs. As each printed circuit board is inserted into a slot, the edge connectors on the board plug into mating connectors that are provided in the slot.

Usually, several printed circuit boards are held in the slots, spaced-apart from each other, in a horizontal row. Alternatively, several printed circuit boards can be held in the slots, spaced-apart from each other, in a vertical column.

Multiple signal lines are provided in the chip testing apparatus which extend from the connectors in the slots to a test signal controller. This controller tests the chips by sending signals to the chips and receiving responses from them. Also, electrical power lines are provided in the chip testing apparatus which extend from the connectors in the slots to one or more power supplies.

Often it is desirable to perform a "burn-in" test on the chips wherein the chips are held at a high temperature while they are tested. In the prior art, that was done by enclosing the chip testing apparatus in an oven and providing fans in the enclosure which circulate hot air past the chips while they are tested.

However, one drawback with the above prior art chip testing apparatus is that the temperature at which the chips are tested cannot be regulated accurately. This inaccuracy is caused, in part, by variations in the temperature and velocity of the air which flows past each of the chips. Also, the inaccuracy is caused by variations in chip power dissipation which occurs while the chips are being tested, and this problem gets worse as the magnitude of the power variations increase.

One prior art mechanism which accurately regulates the temperature of IC chips in a product where the chips are permanently held, such as a computer, is described in U.S. Pat. No. 4,809,134, by Tustaniwskyj, et al, which is entitled "Low Stress Liquid Cooling Assembly". That assembly includes a hollow jacket which carries a liquid coolant and the jacket contacts each IC chip. Thus the temperature of the chips is regulated accurately by conduction.

However, in the above '134 assembly, the jackets are held in place on the chips by a beam; and several bolts must be removed before the jackets can be lifted off the chips. To use such an assembly in a chip-testing environment would be impractical because there, the jackets need to be repeatedly taken off one set of chips and put on another set of chips.

Also, another drawback with the above prior art chip testing apparatus is that due to the row/column arrangement of the printed circuit boards, a large distance inherently exists between the chips that are tested and the power supplies for those chips. Due to those large distances, parasitic resistances, parasitic inductances and parasitic capacitances are inherently large; and thus, the more difficult it becomes to keep the chip voltages; constant while chip power dissipation changes rapidly as the chips are tested.

Accordingly, a primary object of the invention is to provide an improved electromechanical apparatus for testing IC chips which avoids the above drawbacks.

BRIEF SUMMARY OF THE INVENTION

The present invention, as claimed, covers one particular portion of an electromechanical apparatus for testing integrated circuit chips wherein a chip holding subassembly, a lower converter subassembly, and a temperature regulating subassembly are squeezed together in multiple sets by respective pressing mechanisms. A major benefit which is achieved with this electromechanical apparatus is that by pressing the temperature regulating subassembly against the chip holding subassembly, heat can be added/removed from the chips by conduction; and thus the temperature of the chips can be regulated accurately. Another major benefit which is achieved with this electromechanical apparatus is that by pressing the power converter subassembly against the chip holding subassembly, the distance between the chips that are tested and the power supplies for those chips is made small. Consequently, the chip voltages can easily be kept constant while the chip power dissipation changes rapidly as the chips are tested.

The particular portion of the electromechanical apparatus for testing chips which is claimed as the present invention is a generic subassembly which has a structure that is incorporated into the preferred embodiments of both the chip holding subassembly and the power converter subassembly.

This generic subassembly is comprised of a planar substrate having first and second faces that are opposite to each other and are surrounded by an edge that is free of any electrical edge connectors. Attached to the first face of the substrate are a plurality of electrical components that are used in testing the chips, and, distributed on the second face of the substrate are a plurality of electrical contacts which are connected through the substrate to the electrical components on the first face. These electrical contacts get pressed against mating contacts, and they carry all electrical power and all electrical signals for the chips that are tested.

To use the above generic subassembly as the chip holding subassembly, the electrical components on the first face of the substrate include sockets which hold the chips that are tested. In one embodiment, several spacers are also attached to the first face between the sockets, and those spacers have selectable lengths which adjust the force with which the temperature regulating subassembly is pressed against the chips in the chip holding subassembly. To use the above generic subassembly as the power converter subassembly, the electrical components on the first face of the substrate include electrical power converters for the chips that are tested. In one embodiment, the power converters are proximately aligned with the chips that are held by the chip holding subassembly so that the distance between the chips and the power converters is very small.

BRIEF DESCRIPTION OF THE DRAWINGS

FIG. 1C shows a pictorial view of a chip holding subassembly, a power converter subassembly, and a temperature regulating subassembly which are held in multiples in a vertical stack within the electromechanical apparatus of FIGS. 1A and 1B.

FIG. 5 shows a set of equations which are derived from FIG. 4 and which relate certain parameters in the pressing mechanism of FIG. 2.

FIG. 6 shows a set of steps which use the equations of FIG. 5 to select parameters for the pressing mechanism of FIG. 2.

FIG. 7 shows a numerical example of the parameters that are selected by the steps in FIG. 6.

FIG. 8 shows how two forces Fx and Fy vary over a range of angles in the pressing mechanism of FIG. 2 when that mechanism has the parameters in FIG. 7.

FIGS. 14A and 14B show a set of equations which are derived from FIG. 13 and which relate certain parameters in the pressing mechanism of FIG. 12.

FIG. 15 shows a set of steps which use the equations of FIGS. 14A and 14B to select parameters for the pressing mechanism of FIG. 12.

FIG. 16 is a numerical example of the parameters that are selected by the steps in FIG. 15.

FIG. 17 shows how two forces Fx and F2y vary for a range of angles in the pressing mechanism of FIG. 12 when that mechanism has the parameters of FIG. 16.

DETAILED DESCRIPTION

Figure 1A:
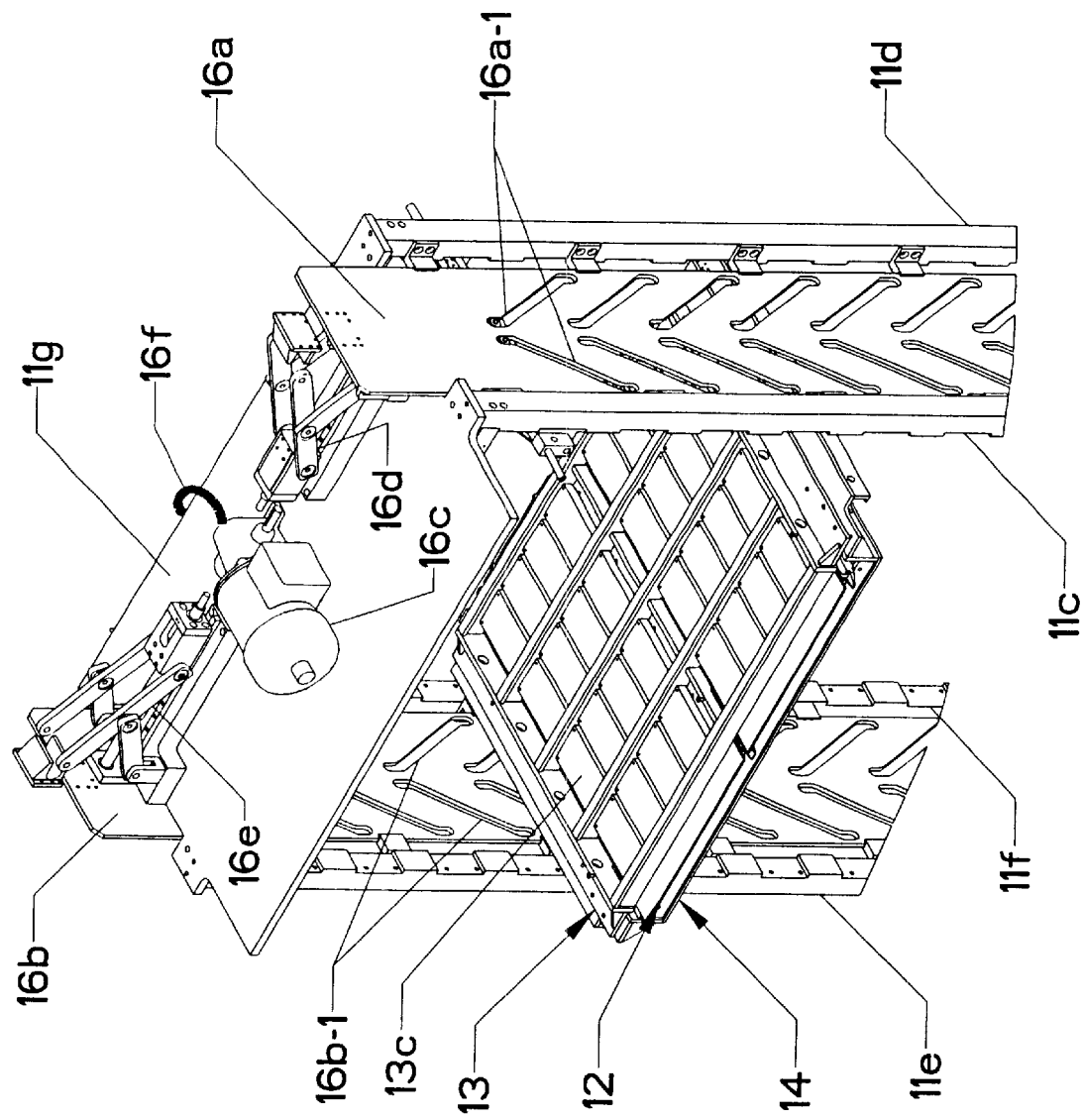
FIG. 1A shows a pictorial view of the top portion of an electromechanical apparatus for testing IC chips which constitutes one preferred embodiment of the present invention.

With reference now to FIGS. 1A, 1B, 1C and 2, one preferred embodiment of the present invention will be described. This embodiment is an electromechanical apparatus 10 for testing IC chips on multiple printed circuit boards which are held in a vertical stack and which have faces with pressed electrical contacts that carry all power and all signals to/from the chips.

The apparatus 10 is comprised of six different types of subassemblies 11–16; and each subassembly includes several components. All of the components of any one particular subassembly are identified by the same reference numeral with a different letter appended to it. For example, components 11a–11g are in subassembly 11. Each subassembly 11–16, and their respective components, will now be described.

Subassembly 11 is a frame that includes components 11a–11g. Component 11a is a horizontal base of the frame which has several legs 11b that are rigidly connected to the base 11a. Components 11c–11f are four vertical columns which are rigidly connected to the base 11a; and component 11g is a top of the frame which is rigidly connected to the columns 11c–11f.

Subassembly 12 is a chip holding subassembly which includes components 12a–12d. From one to fourteen of these chip holding subassemblies 12 are held by the frame 11. Component 12a is a printed circuit board which has one face 12a-1 and an opposite face 12a-2. Face 12a-1 is seen only in FIG. 2, and attached to it are N sockets 12b, each of which holds one IC chip 12c that is to be tested. Here, N is any desired number, such as sixteen or thirty for example. Attached to face 12a-2 are N sets of electrical contacts 12d, and each set carries all of the electrical power and all signals for one of the chips 12c. Each socket 12b is connected to one set of contacts 12d by microscopic conductors (not shown) that pass thru the printed circuit board 12a.

Subassembly 13 is a power converter subassembly which includes components 13a–13c. A separate power converter subassembly 13 is held by the frame 11 above each chip holding subassembly 12. Component 13a is a printed circuit board which has one face 13a-1 and an opposite face 13a-2. Face 13a-1 is seen only in FIG. 2, and attached to it are N sets of electrical contacts 13b, each of which mates with one set of the contacts 12d on the chip holding subassembly 12. Attached to face 13a-2 are N DC-DC power converters 13c. Each power converter 13c supplies power to one set of the contacts 13b, and it is connected to those contacts by microscopic conductors (not shown) that pass through the printed circuit board 13a.

Subassembly 14 is a temperature regulating subassembly which includes components 14a–14d. A separate temperature regulating subassembly 14 is held by the frame 11 below each chip holding assembly 12. Component 14a is a flat rigid plate which has one face 14a-1 and an opposite face 14a-2. Attached to face 14a-2 are N springy components 14b, and each springy component 14b holds one temperature regulating component 14c such that it is aligned with one chip 12c in the chip holding assembly 12.

Each temperature regulating component 14c can be of a type which removes heat from the chips 12c by conduction, such as a heat sink; or it can be of a type which adds heat to the chips 12c by conduction, such as an electric resistor; or it can be a combination of both types. Several stops 14d are attached to the face 14a-2, and they are aligned with the spaces between the sockets 12b in the chip holding assembly 12.

Figure 20:
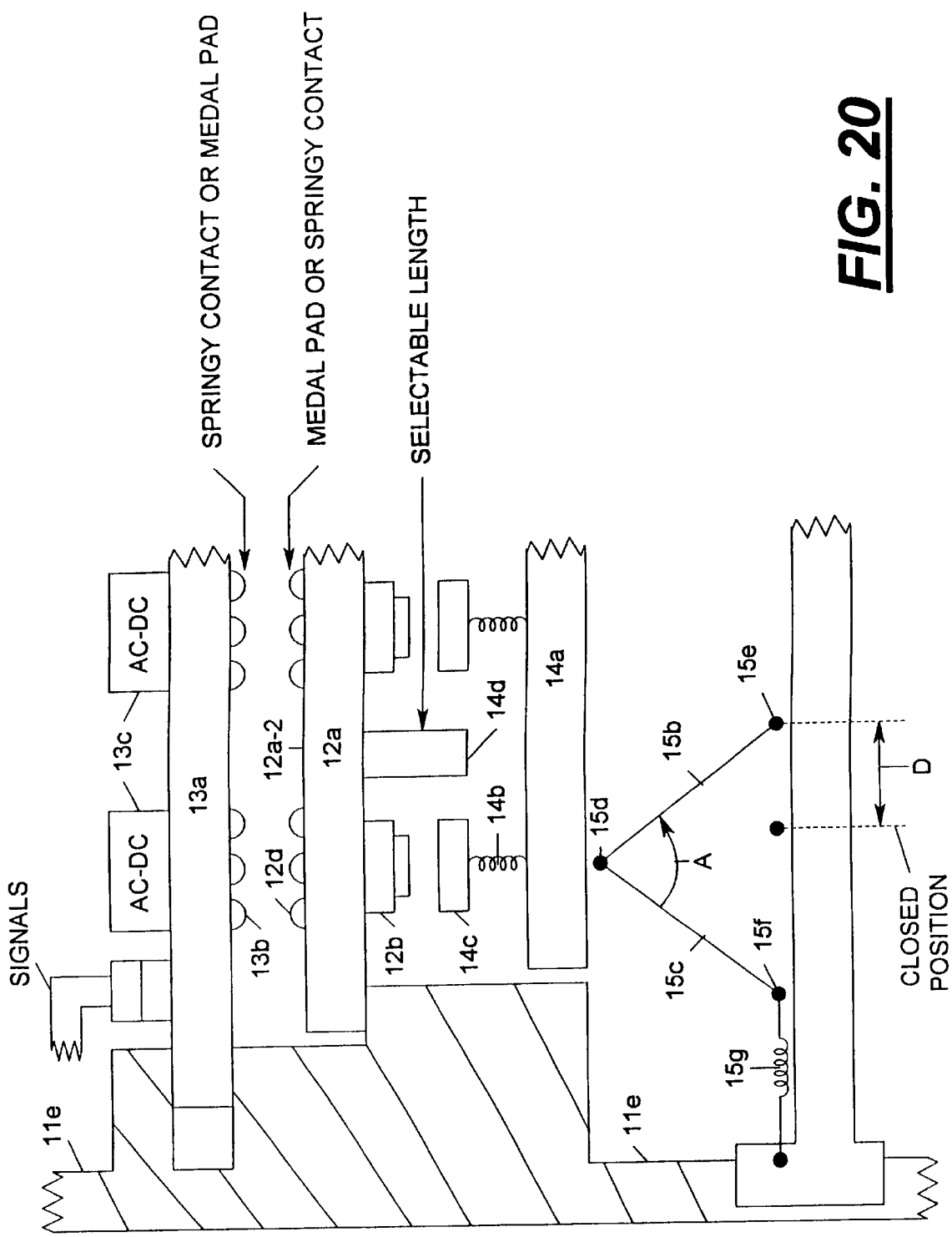
FIG. 20 shows various modifications that can be made to the subassemblies that are in FIG. 2.

These stops 14d limit the force with which the temperature regulating components 14c can be pressed against the chips 12c. This is achieved by limiting the amount by which the springy components 14b get compressed when the subassemblies 12–14 are squeezed together. Preferably, the stops 14d have a length which is selectable within a predetermined range so that the temperature regulating components 14c are pressed against the chips 12c with a force that can be adjusted up or down. See FIG. 20.

Subassembly 15 is a pressing mechanism which presses the subatisemblies 12, 13 and 14 together. In order to press those subassemblies 12–14 together, the power converter subassembly 13 is held stationary in the frame 11, and the pressing mechanism 15 moves the temperature regulating subassembly 14 upward. This upward movement causes the chip holding subassembly 12 to be squeezed between the temperature regulating subassembly 14 and the power converter subassembly 13.

For each chip holding subassembly 12 that is held in the frame 11, two copies of the pressing mechanism 15 are provided. One copy is held in the frame by columns 11c and 11d, while the other copy is held in the frame by columns 11e and 11f. Several different embodiments of the pressing mechanism 15 are described in detail herein in conjunction with FIGS. 2–19.

Subassembly 16 is an actuator for all of the pressing mechanisms 15 which are in the frame 11, and it includes components 16a–16f. Component 16a is a plate which moves up and down in the frame between columns 11c and 11d. Component 16b is identical to plate 16a, and it moves up and down in the frame between columns 11e and 11f. Plate 16a has a separate pair of slots 16a-1 for each pressing mechanism 15 that is held by the frame columns 11c and 11d, and plate 16b has a separate pair of slots 16b-1 for each pressing mechanism 15 that is held by the frame columns 11c and 11f.

As the plates 16a and 16b move, the slots 16a-1 and 16b-1 act as tracks which cause all of the pressing mechanisms 15 to move. When the plates 16a and 16b move down, the pressing mechanisms 15 move to an open position where the subassemblies 12, 13 and 14 are spaced-apart. Conversely, when the plates 16a and 16b move up, the pressing mechanisms 15 move to a closed position where the subassemblies 12, 13 and 14 are pressed together.

Component 16c is an electric motor. Component 16d is a linkage between the motor 16c and plate 16a; and component 16e is a linkage between the motor 16c and plate 16b. These components 16c–16e move the plates 16a and 16b up, and move the plates down, in response to control signals that are sent on conductors 16f to the motor 16c from manually operated control switches (not shown).

Figure 2:
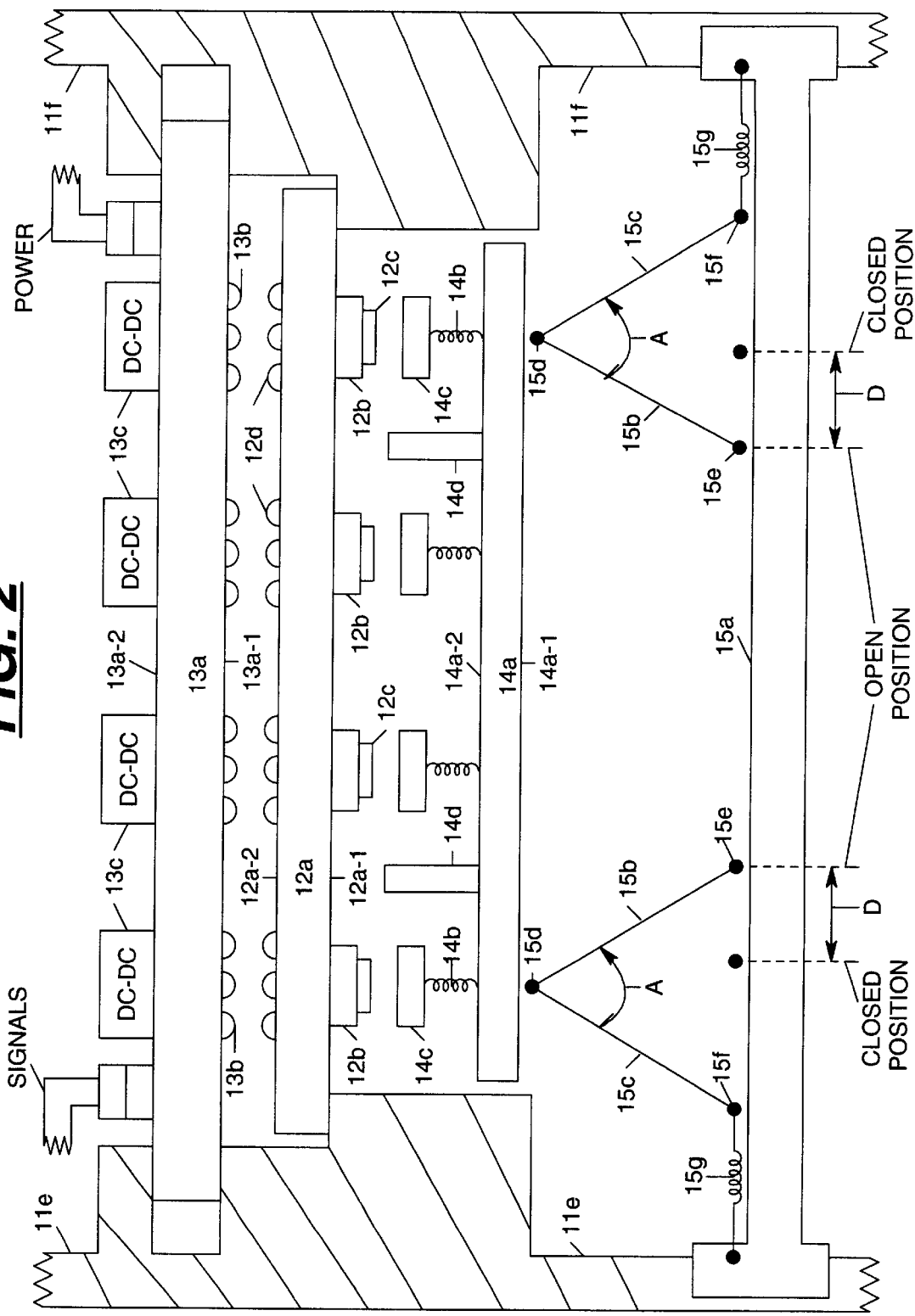
FIG. 2 is a schematic diagram of the three subassemblies of FIG. 1C, plus a pressing mechanism within the electromechanical apparatus of FIGS. 1A and 1B, which squeezes the three subassemblies together.

How the chip holding subassembly 12, the power converter subassembly 13, the temperature regulating subassembly 14, and the pressing mechanism 15 are held relative to each other by the frame 11 is shown schematically in FIG. 2. In addition, FIG. 2 schematically illustrates how the pressing mechanism 15 squeezes the chip holding subassembly 12 between the power converter subassembly 13 and the temperature regulating subassembly 14.

Included within the pressing mechanism 15 of FIG. 2 are components 15a–15g. Component 15a is a rail which is rigidly attached to the frame columns 11e and 11f. This rail 15a lies below the temperature regulating subassembly 14 and is parallel to face 14a-1 of the plate 14a. Components 15b and 15c are a pair of arms that are coupled together with a pivotal joint 15d which presses against face 14a-1 of the plate 14a. These arms 15b and 15c also have slidable joints 15e and 15f which slide on the rail 15a. Component 15g is a spring which is coupled between the slidable joint 15f and the frame 11. All of the components 15b–15g are duplicated in the pressing mechanism 15 as shown in FIG. 2.

Both of the slidable joints 15e fit into one pair of the slots 16b-1 in the plate 16b. The slots 16b-1 of each pair are close together at their top and far apart at their bottom. Thus, as the plate 16b move down, the joints 15e slide close together to an "open" position. There, the angle "A" between each pair of arms 15b and 15c is large; and so the pivotal joints 15d have moved down. Consequently, the three subassemblies 12, 13, and 14 are spaced apart from each other.

Conversely, as the plate 16d moves up, the joints 15e slide far apart to a "closed" position. There, the angle "A" between each pair of arms is small; and so the pivotal joints 15d have moved up. Consequently, the three subassemblies 12, 13, and 14 are squeezed together.

When the arms 15b are in the closed position, the angle "A" which is between each pair of arms 15b and 15c does not have a single value. Instead, the angle "A" in the closed position is a variable which ranges from A1 to A2; and why this is so is illustrated in FIG. 3.

Figure 3:
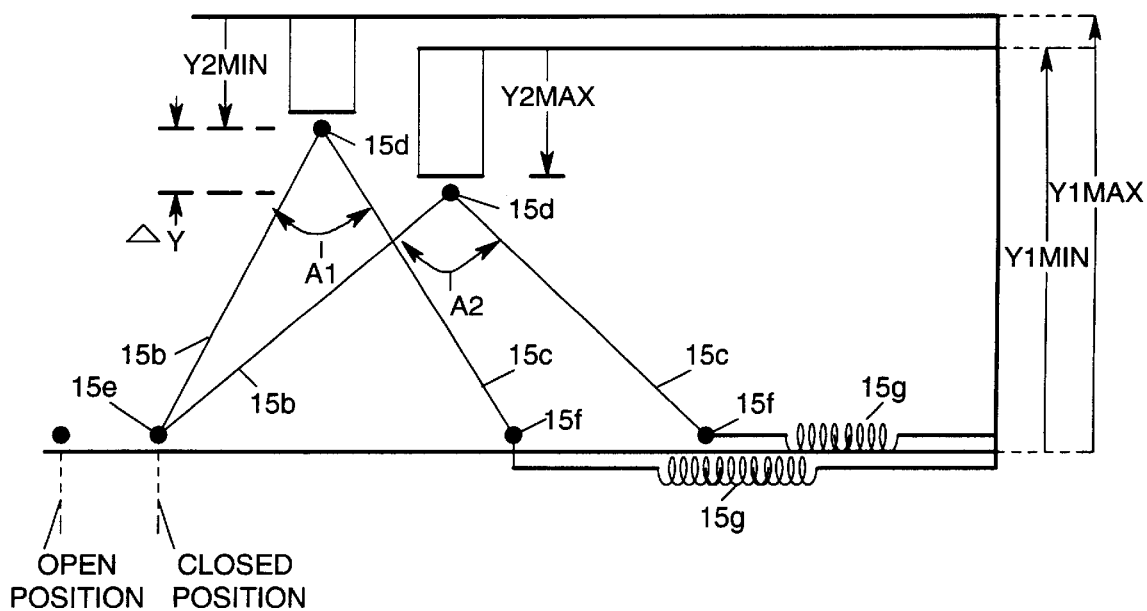
FIG. 3 shows the pressing mechanism of FIG. 2 is in a closed position where the angle between two arms in the pressing mechanism can range from A1 to A2.

In FIG. 3, the dimension Y1 is the distance from the top of the rail 15a in the pressing mechanism 15 to face 13a-1 of. component 13a. Due to various manufacturing tolerances in components 11e and 11f, the dimension Y1 can vary between a minimum of Y1MIN and a maximum of Y1MAX.

Also in FIG. 3, the dimension Y2 is the combined thickness of the components 13b, 12d, 12a and 14a plus the length of component 14d. The thicknesses of components 13b, i2d, 12a and 14a can vary due to manufacturing tolerances; and, the length of component 14d is selectable in order to adjust the force with which the temperature regulating components 14c are pressed against the chips 12c. Thus the dimension Y2 will vary between a minimum of Y2MIN and a maximum of Y2MAX.

When Y1 has its maximum value and Y2 has its minimum value, the angle A between the arms 15b and 15c in the closed position has its smallest value which is the angle A1. Conversely, when Y1 has its minimum value and Y2 has its maximum value, the angle A between the arms 15b and 15c in the closed position has its largest value which is the angle A2.

As the angle A between the arms 15b and 15c increases from this angle A1 to the angle A2, the spring 15g gets compressed by an increasing amount. Thus, as the angle A increases from angle A1 to angle A2, the spring 15g exerts a force on the sliding joint 15f which increases monotonically.

However, in accordance with one feature of the pressing mechanism 15, the force with which the pivotal joint 15d squeezes the subassemblies 12–14 together does not monotonically increase as the angle A between the arms 15b and 15c increases from A1 to A2. Instead, that force initially increases and then decreases; and the reason for this will now be described in conjunction with FIGS. 4–8.

Figure 4:
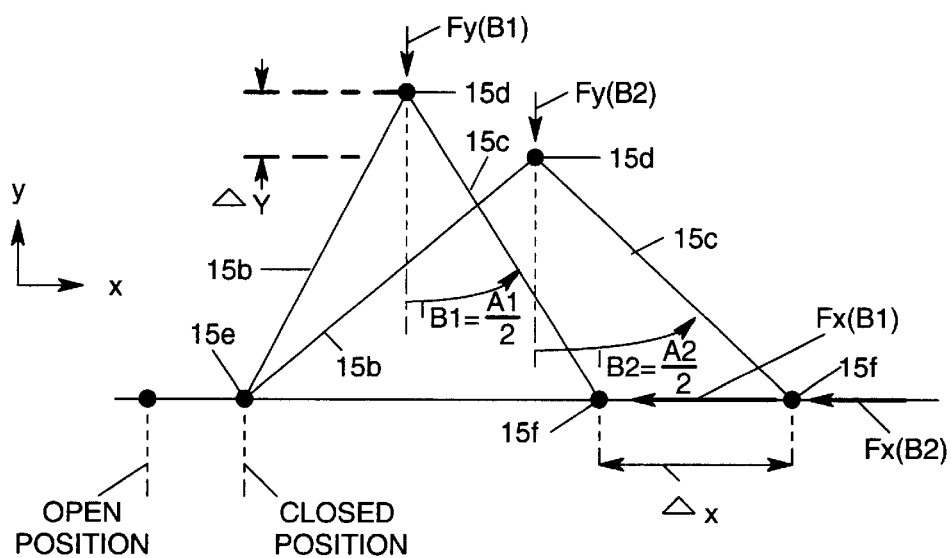
FIG. 4 shows various forces which occur in the pressing mechanism of FIG. 2 when its arms are at the two different closed positions which are shown in FIG. 3.

In FIG. 4, the arms 15b and 15c are again shown just like they are in FIG. 3. However, in FIG. 4, a force vector Fx is shown which pushes against the sliding joint 15f, and that force vector is caused by the spring 15g. Similarly, in FIG. 4, a force vector Fy is shown which pushes against the pivotal joint 15d, and that force vector is due to the subassemblies 12–14 being squeezed by the pivotal joint 15d. Thus, both of the arms 15b and 15c are in compression.

Also in FIG. 4, two angles B1 and B2 are shown; and they respectively equal one-half of the angles A1 and A2 that are shown in FIG. 3. These half angles B1 and B2 are shown in FIG. 4, rather than the full angles A1 and A2, because they are more useful in the analysis which is made by several equations that are shown in FIG. 5.

In equation 1, an expression is given for the spring constant K of the spring 15g. Equation 1 indicates that the spring constant K is equal to the force which is exerted by the spring 15g at the angle B2 minus the force which is exerted by the spring 15g at the angle B1, divided by a distance $\Delta x$. That distance $\Delta x$, as is shown in FIG. 4, is the distance by which the spring 15g is compressed as the angle B increases from B1 to B2.

An expression for the distance $\Delta x$ is given by equation 2. There the parameter L is the length of each of the arms 15b ad 15c. Equation 2 is obtained from the geometries in FIG. 4. Then, equation 3 is obtained by substituting equation 2 into equation 1.

Inspection of equation 3 shows that the numerator contains two terms which represent the forces Fx that are exerted by the spring 15g. Then, by equation 4 through equation 10, the two force terms Fx are translated to the corresponding orthogonal forces Fy which are exerted by the pivotal joint 15d on the subassemblies 12–14.

To begin the above translation, equation 4 states that the force Fy which is exerted against the pivotal joint 15d is equal to the force Fa which is exerted by each one of the arms 15b or 15c, times the cosine of the angle B, times "2".

Equation 4 is obtained by summing the forces in the vertical direction "y" on the pivotal joint 15d. Force Fa as exerted parallel to the longitudinal axis of each arm; and thus its component in the y direction is given by the cosine term. Also, the factor of "2" occurs in equation 4 because each of the arms 15b and 15c push the pivotal joint 15d upward with the same forces Fa.

Next, equation 5 relates the force Fa, which is exerted by each of the arms 15b and 15c, to the force Fx which is exerted by the spring 15g. According to equation 5, the spring force Fx is equal to the force Fa times the sine of the angle B. Equation 5 is obtained by summing the forces which occur in the horizontal direction "x" on the slidable joint 15f.

By dividing equation 4 with equation 5, equation 6 is obtained. In that division, the force Fa in the numerator cancels out with the force Fa in the denominator. Then, equation 6 can be rewritten as equation 7 which says that the force Fx is equal to one half of the tangent of the angle B times the force of Fy.

When the angle B equals the particular angle B1, equation 7 can be rewritten as equation 8. Likewise, when the angle B has the particular value B2, equation 7 can be rewritten as equation 9. Then, equations 8 and 9 can be substituted into the numerator of equation 3, and the result yields a new expression for the spring constant K which is given by equation 10.

Inspection of equation 10 shows that the denominator contains the parameter L which is the length of each of the arms 15b and 15c. But, by utilizing equations 11 and 12, the parameter L can be removed from equation 10 and replaced with another parameter $\Delta y$.

In equation 11, $\Delta y$ is the vertical distance by which the pivotal joint 15d moves as the angle B varies from B1 to B2. Equation 11 is obtained from the geometries that are shown in FIG. 4. By rearranging the terms which are in equation 11, an expression for L is obtained as shown by equation 12. Then, substituting equation 12 into equation 10 yields equation 13.

Equation 13 is a complex expression for the spring constant K of the spring 15g; and that expression includes two force terms which are Fy(B1) and Fy(B2). In equation 14, both of those force terms are set equal to the same force Fy(MIN). Then, substituting equation 14 into equation 13 yields equation 15. By selecting the spring constant K in accordance with equation 15, the result of Fy(B1) equal to Fy(B2) will be achieved.

This means that the pivotal joint 15d will press the subassemblies 12–14 together with the same force Fy(MIN) when the angle between the arms 15b and 15c is either B1 or B2 as shown in FIG. 4. And, this result occurs even though the spring 15g is compressed by two different amounts at the angles B1 and B2.

In order to construct the pressing mechanism 15 such that equation 15 is met, the steps S1–S5 which are listed in FIG. 6 can be performed. Initially, in step S1, the force Fy(MIN) in equation 15 is selected as one design constraint, and the distance $\Delta y$ in equation 15 is selected as another design constraint.

Here, the force Fy(MIN) is selected based on the minimum force with which the mating electrical contacts 12d and 13b need to be pressed together. For example, suppose that the total number of the contacts 12d is 110, and suppose that each contact 12d needs to be pressed against a corresponding contact 13b with a minimum force of 2 pounds. Also, suppose that the subassemblies 12 and 14 each weigh 10 pounds. Then the force Fy(MIN) which needs to be exerted by each of the four joints 15d is set equal to 110 times 2 plus 20, divided by 4, or 60 pounds.

Likewise, the distance Δy is selected based on the manufacturing tolerances and selectable length variations that were described in conjunction with FIG. 3. For example, if the stops 14d have a selectable length that varies by 0.17" and components 11f, 13b, 12d 12a, and 14a have a combined manufacturing tolerance of 0.03", then the distance Δy is set equal to 0.20".

Next, the angles B1 and B2 are selected for equation 15. In step S2 of FIG. 6, the angles B1 and B2 are selected such that the force Fx which is exerted by the spring 15g on the pivotal joint 15f at each of the angles B1 and B2 is less than the force Fy which is exerted by the pivotal joint 15d on the Subassemblies 12–14. To meet this constraint, equations 8 and 9 are used since they relate the force Fx to the force Fy at each of the angles B1 and B2.

By performing step S2, a mechanical advantage is obtained which reduces the total force that needs to be applied by the actuator 16 in order to move the slidable joint 15e of all of the pressing mechanisms 15 from the open position to the closed position. The magnitude of this mechanical advantage is equal to Fy divided by Fx. Here Fx is the force which is exerted by the spring 15g on the slidable joint 15; and, that spring force Fx is equal in magnitude to the force which must be exerted by the actuator slots 16a-1 on the slidable joint 15e.

In equations 8 and 9, the tangent of the angles B1 and B2 decreases as those angles decrease; and this suggests that the angles B1 and B2 should be as small as possible in order to maximize the mechanical advantage. However, as the angles B1 and B2 get smaller, the amount by which the joint 15d moves in the vertical direction, for each degree of change from angle B1 to angle B2, gets smaller. Thus, in order to meet the design constraint of Δy, the angles B1 and B2 should not be made too small. Preferably, the angles B1 and 32 are selected to be from 10° to 40°.

Suppose for example, that the angle B1 is selected to be 20° and the angle B2 is selected to be 29°. Then, for the angle B1=20°, the mechanical advantage is Fy(20°) divided by Fx(20°); and it can be calculated from equation 8 as being equal to 5.49. Likewise, the mechanical advantage at angle B2=29° is Fy(29°) divided by Fx(29°); and it can be obtained from equation 9 as being equal to 3.61.

Next, in accordance with step S3 of FIG. 6, the spring constant k is calculated from equation 15 by utilizing the parameters of Fy(MIN), Δy, B1 and B2 that were selected in steps S1 and S2. Also, those same parameters can be used in conjunction with equation 12 to calculate the length L of each of the arms 15b and 15c; and this is done by step S4 in FIG. 6.

What remains to be done after step S4 is to determine the amount by which the spring 15g needs to be compressed when the angle B equals B1; and this is done in FIG. 6 by step S5. There, the force which is exerted by the spring 15g when the angle B equals B1 is determined from equation 8; and that force is set equal to the spring constant k times a distance Δx0, which is the distance by which the spring 15g is compressed at the angle B1. That distance Δx0 is the only unknown term that occurs in step S5; and so it can be calculated from all of the other terms.

A numerical example of the above steps S1–S5 is shown in FIG. 7. There, in step S1, the minimum force Fy(MIN) is set equal to 60 pounds and the parameter Δy is set equal to 0.20 inches. Also, in step S2, the angles B1 and B2 are set equal to 20° and 29° respectively.

Utilizing the above selections, steps S3 and S4 are performed whereby the spring constant k is calculated to be 6.45 pounds per inch and the length L of each of the arms 15b and 15c is calculated to be 3.1 inches. Then, by step S5, the distance Δx0 by which the spring 15g is compressed at the angle B1 is determined to be 1.693 inches.

When the pressing mechanism 15 is constructed with the parameters that are given in FIG. 7, the forces Fx and Fy which occur for various angles B are listed in FIG. 8. There the units for the angle B is degrees, and the units for the forces Fx and Fy is pounds. Inspection of FIG. 8 shows that at each of the angles of B1=20° and B2=29°, the force Fy which is exerted by the pivotal joint 15b equals the desired minimum force of 60 pounds. This occurs even though the force Fx which is exerted by the spring 15g at the angle B1=20° is completely different than the force Fx which is exerted by the spring at the angle B2=29°.

Inspection of FIG. 8 also shows that as the angle B decreases from the angle B2 to the angle B1, the force Fx decreases monotonically, whereas the force Fy initially increases and then decreases. This decrease in the force Fy after the initial increase is important because it reduces the maximum force with which the subassemblies 12–14 are pressed together; and that prevents any of the subassembly components from being overstressed and permanently damaged. For example, if the force Fy gets too large, the printed circuit boards 12a and 14a could get bent.

Inspection of FIG. 8 further shows that as the angle B decreases from the angle B1 to the angle B2, the mechanical advantage with which the actuator 16 moves the slidable joint 15e monotonically increases. This mechanical advantage equals Fy/Fx as was previously described. However, as the angle B decreases from B1 to B2, the force Fx with the spring 15g pushes the arms together monotonically decreases. This decrease in the force Fx counteracts the increase in the mechanical advantage, and that causes the force Fy to decrease after its initial increase.

Figure 9:
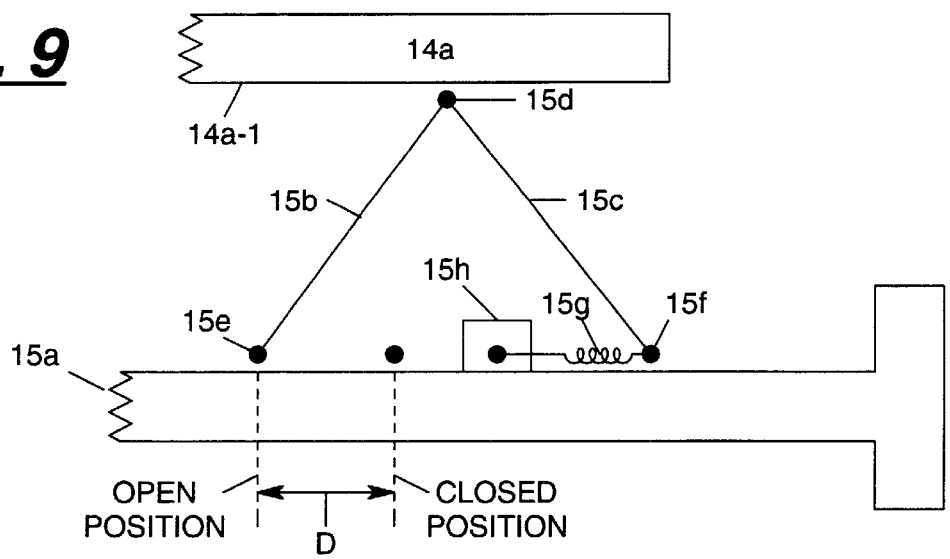
FIG. 9 shows a second embodiment of a pressing mechanism which has some similarity to the pressing mechanism of FIG. 2.

Turning now to FIG. 9, a second embodiment of the pressing mechanism 15 will be described. This second embodiment of the pressing mechanism 15 is similar to the first embodiment which was described above in conjunction with FIGS. 2–8; and, the similarities can be seen by comparing FIG. 2 with FIG. 9.

In the FIG. 9 pressing mechanism, all of the components 15a–15g from FIG. 2 are repeated, but the coupling to the spring 15g is changed. More specifically, in the FIG. 9 pressing mechanism, another member 15h is included which is rigidly attached to the rail 15a; and the spring 15g is coupled between that member 15h and the slidable joint 15f of the arm 15c.

In operation, the spring 15g is stretched by an increasing amount as the arm 15b moves from the open position to the closed position. By comparison, in the embodiment of FIG. 2, the spring 15g is compressed by an increasing amount as the arm 15b moves from the open position to the closed position.

All of the analysis that was given by equations 1–15 of FIG. 5 also applies to the pressing mechanism of FIG. 9. Consequently, all of the steps S1–S5 of FIG. 6 should be followed in order to construct the pressing mechanism of FIG. 9 such that the force Fx (which is exerted by the spring 15g) increases monotonically, while the force Fy (which squeezes the subassemblies 12–14 together) initially increases and then decreases.

Next, with reference to FIGS. 10A and 10B, a third embodiment and a fourth embodiment of the pressing mechanism 15 will be described. In both of these embodiments, all of the components 15a–15g from FIG. 2 are again repeated; but, the coupling to the spring 15g, as well as the coupling to both of the joints 15e and 15f, is changed.

Figure 10A:
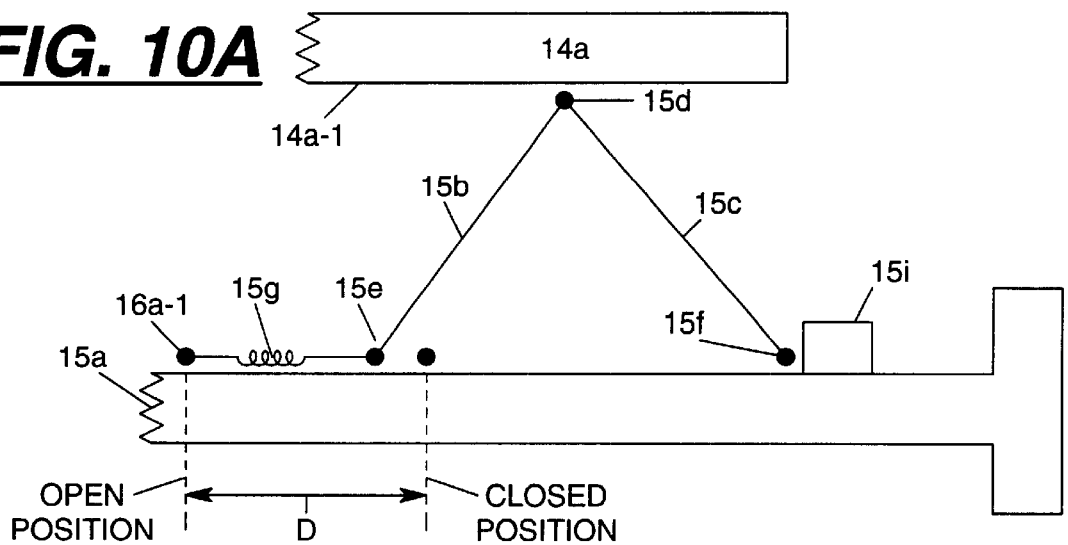
FIG. 10A shows a third embodiment of a pressing mechanism which has some similarity to the pressing mechanism of FIG. 2.
Figure 10B:
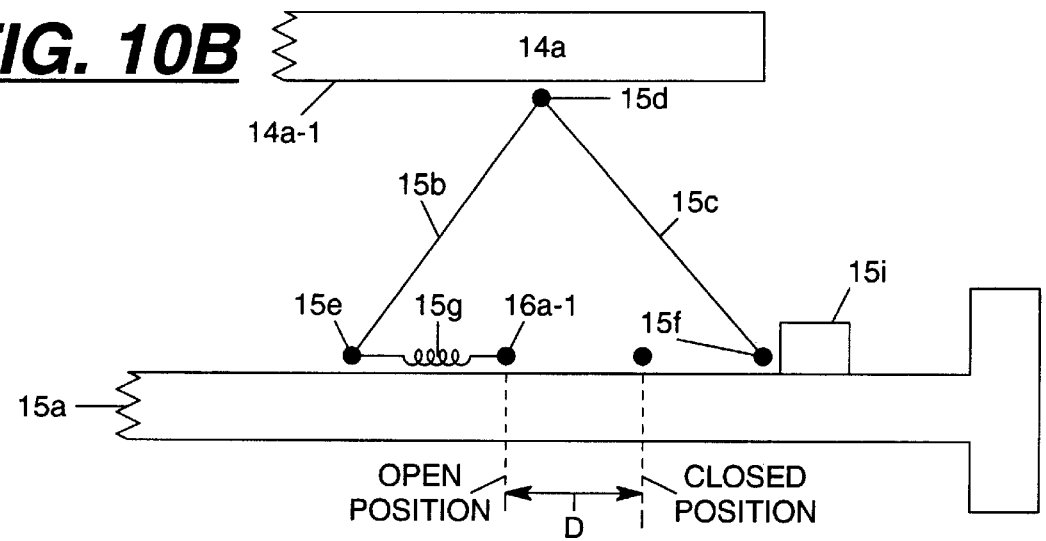
FIG. 10B shows a fourth embodiment of a pressing mechanism which has some similarity to the pressing mechanism of FIG. 2.

Specifically, the embodiments of FIGS. 10A and 10B each include a member 15i which is rigidly attached to the rail 15a; and, the joint 15f is pushed against that member 15i such that it can pivot, but not slide. Further, in the embodiments of FIGS. 10A and 10B, the spring 15g is coupled between joint 15e of the arm 15b and one of the slots 16a-1 of the actuator 16. In the embodiment of FIG. 10A, the spring 15g is compressed by an increasing amount as the actuator moves the spring from the open position to the closed position; whereas in the embodiment of FIG. 10B, the spring 15g. is stretched by an increasing amount as the actuator moves the spring from the open position to the closed position.

All of the analysis which is made by equations 1–15 of FIG. 5 also applies to the embodiments of FIGS. 10A and 10B. Consequently, to construct the embodiments of FIGS. 10A and 10B such that the force Fx (which is exerted by the spring 15g) increases monotonically, while the force Fy (which squeezes the subassemblies 12–14 together) initially increases and then decreases, steps S1–S5 of FIG. 6 should be followed.

Next, with reference to FIG. 11, a fifth embodiment of the pressing mechanism 15 will be described. This fifth embodiment of FIG. 11 is similar to the second embodiment of FIG. 9; and the similarities can be seen by comparing those two FIGS. 9 and 11.

Figure 11:
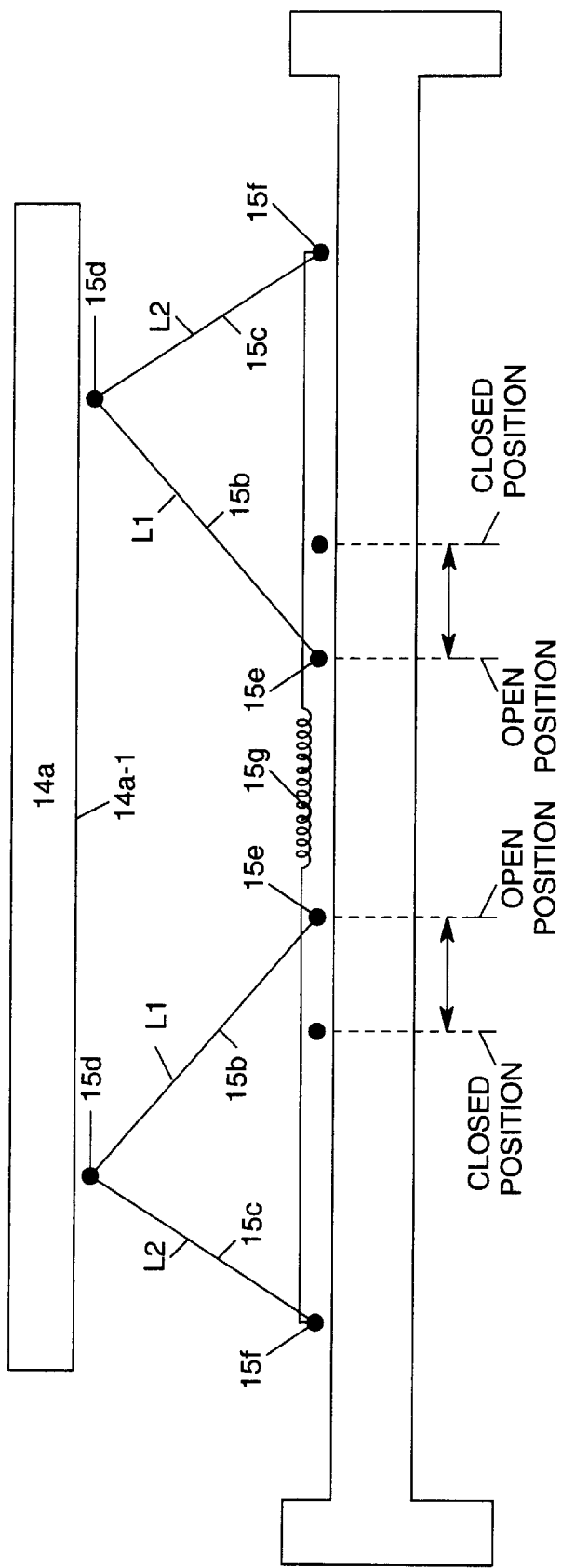
FIG. 11 shows a fifth embodiment of a pressing mechanism which has some similarity to the pressing mechanism of FIG. 2.

One difference between the embodiments of FIGS. 9 and 11 is that in the embodiment of FIG. 11, a single spring 15g is stretched between one arm 15c and another arm 15c of two different pair of arms 15b and 15c. By comparison in the embodiment of FIG. 9, a single spring 15g is stretched between arm 15c and member 15h for each pair of arms. Thus, the FIG. 11 embodiment has half as many springs 15g as the FIG. 9 embodiment.

Also, the embodiment of FIG. 11 illustrates another modification which is that the arms 15b and 15c have different lengths L1 and L2. This modification applies not just to the embodiment of FIG. 11; but it also can be incorporated into each of the embodiments of FIGS. 2, 9, 10A and 10B.

Figures 11A, 11B:
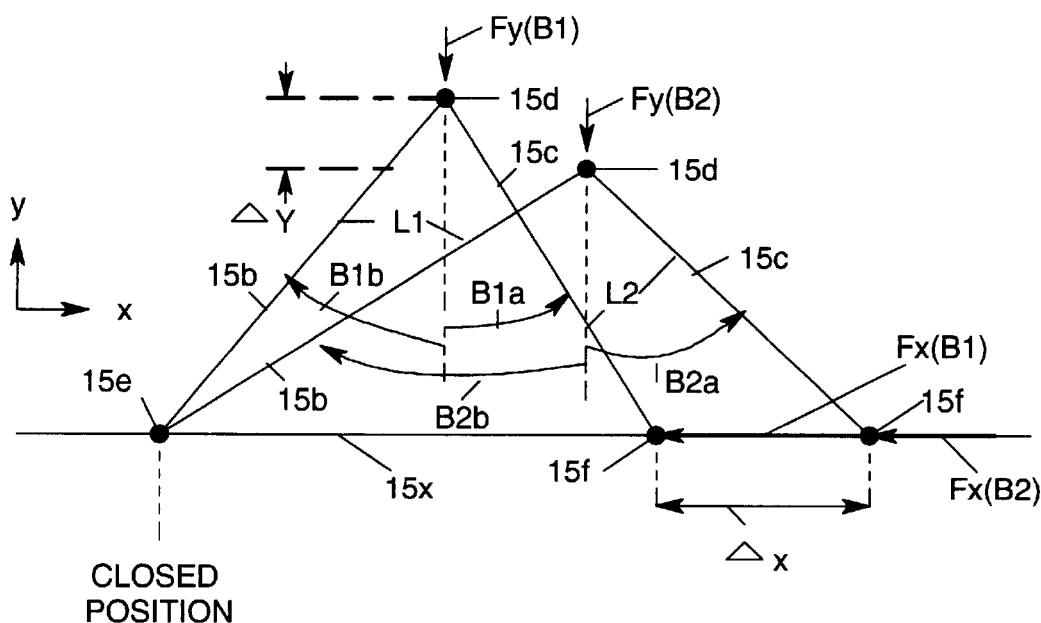
FIG. 11A shows an equation which relates certain parameters in the pressing mechanism of FIG. 11.
FIG. 11B illustrates the various parameters which are in the equation of FIG. 11A.

When the arms 15b and 15c have the different lengths of L1 and L2, the expression for the spring constant k as given by equation 15 in FIG. 5 must be modified; and, that modification is given by equation 15' in FIG. 11A. Equation 15' is derived by following the same process which generated equation 1 thru equation 14 of FIG. 5 while using the lengths L1 and L2 to reflect the different arm lengths.

Equation 15' of FIG. 11A contains four new variables which are angles B1a, B1b, B2a and B2b. All of these angles are defined as shown in FIG. 11B. For example, angle B1a is the angle of arm 15c relative to the vertical axis Y when the total angle A between the arms 15b and 15c iLn the closed position has the minimum value A1. Similarly, angle B2a is the angle of arm 15c relative to the vertical axis Y when the total angle A between the arm 15b and 15c in the closed position has the maximum value A2.

Figure 12:
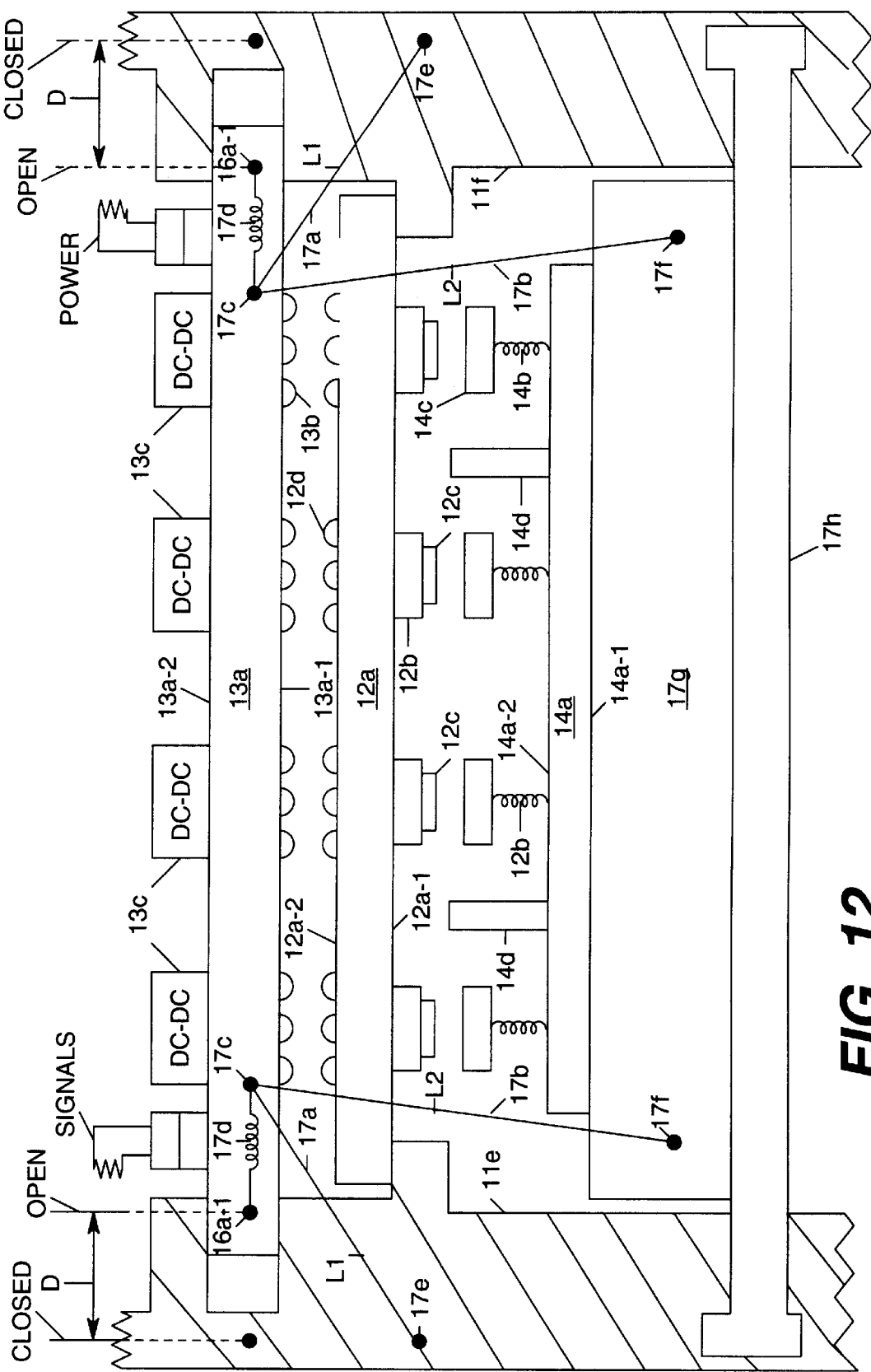
FIG. 12 shows a sixth embodiment of a pressing mechanism which is substantially different than the pressing mechanisms of FIGS. 2, 9, 10A, 10B, and 11.

Referring next to FIG. 12, a sixth embodiment of the pressing mechanism will be described. This embodiment includes components 17a–17h, and it is substantially different than the embodiments of FIGS. 2–11. All of the remaining components which are shown in FIG. 12 are the same as those which were previously shown and described in conjunction with FIG. 2, and they are identified with their previous reference numerals.

Components 17a and 17b are a pair of arms which are coupled together by a pivotal joint 17c. A spring 17d is coupled between the pivotal joint 17c and one of the slots 16a-1 of the previously described actuator 16. As the actuator moves from the open position to the closed position, the spring 17d is stretched by an amount which monotonically increases.

Arm 17a has a pivotal joint 17e which is coupled to the frame column 11f; and, arm 17b has a pivotal joint 17f which is coupled to a vertically moveable base member 17g. When the actuator 16 is in the open position, the base member 17g rests on a rail 17h which is rigidly coupled between the frame columns 11e and 11f.

All of the components 17a–17f are replicated for each of the four columns 11c–11f in the frame 11. FIG. 12 shows how two copies of the components 17a–17f are coupled to the frame columns 11e and 11f. Two other copies of the components 17a–17f are coupled to the frame columns 11c and 11d in the same fashion.

By comparing the pressing mechanism 17 of FIG. 12 to the previously described pressing mechanisms of FIGS. 2–11, four major differences can be seen. First, in the pressing mechanism 17 of FIG. 12, each of the arm joints 17c, 17e, and 17f pivot; but none of those joints slide. Second, in the pressing mechanism 17 of FIG. 12, the spring 17d is coupled to the pivotal joint 17c between the arms 17a and 17b, as opposed to being coupled to a sliding joint of a single arm. Third, in the pressing mechanism 17 of FIG. 12, the subassemblies 12–14 are squeezed together by a single arm 17b which lifts the base member 17g vertically. Fourth, as the subassemblies are squeezed together, arm 17b is in tension and arm 17a is in compression, as opposed to both arms being in compression.

In FIG. 12, the pressing mechanism 17 is shown in an open position where the subassemblies 12–14 are spaced apart from each other. As the actuator slots 16a-1 move the pressing mechanism 17 from the open position to a closed position, the amount by which the spring 17d is stretched increases monotonically. That causes the force Fx which is exerted by the spring 17d on the pivotal joint 17c to increase monotonically, and thus the base 17g moves upward and squeezes the subassemblies 12–14 together.

Figure 13:
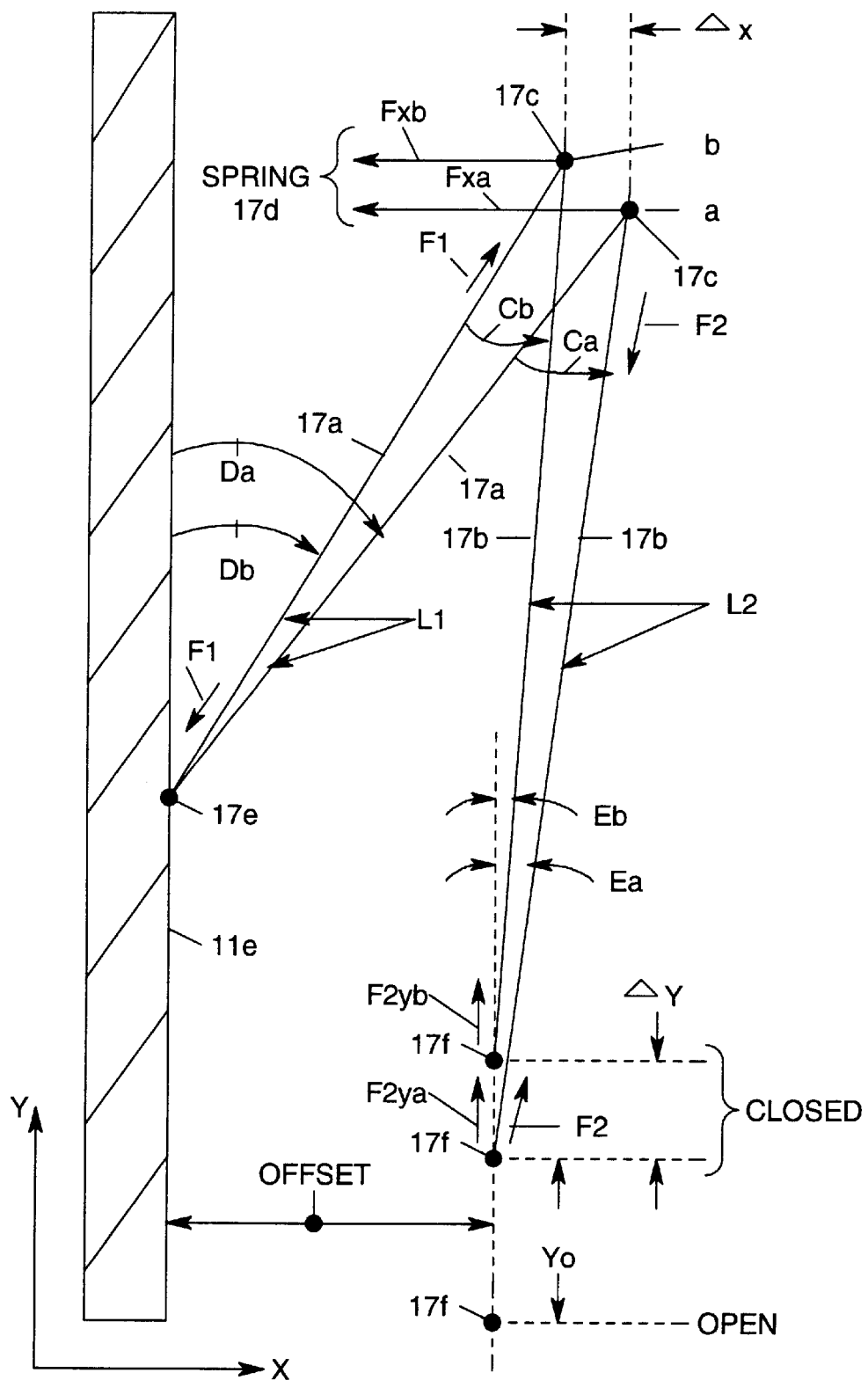
FIG. 13 shows various forces which occur in the pressing mechanism of FIG. 12 when its arms are at two different closed positions.

Now, the distance by which the base 17g moves upward from the open position to the closed position is not fixed. Instead, that distance is a variable as shown in FIG. 13. There, the pivotal joint 17f moves by a minimum distance of Yo from the open position to the closed position, Bad moves by a maximum distance of Yo plus Δy from the open position to the closed position. The distance Δy is caused by variations in the length of the stop 14d which are selectable, and by manufacturing tolerances of the components 11e, 11f, 13b, 12d, 12a and 14a.

Due to the above variation Δy, the joint 17c has a variable location in the closed position which ranges from one point "a" to another point "b" as shown in FIG. 13. When the joint 17c is located at point all, the angle C which occurs between the arms 17a and 17b has a value Ca, whereas when the joint 17c is located at point "b", the angle C has a value Cb.

Likewise, when the pivotal joint 17c is located at point "a", the angle D which occurs between the arm 17a and the vertical axis Y has a value Da, and the angle E which occurs between the arm 17b and the vertical axis has a value Ea. By comparison, when the pivotal joint 17c is located at point "b", the angle D between arm 17a and the vertical axis has a value Db, and the angle E between arm 17b and the vertical axis has a value Eb.

As the joint 17c moves from point "b" to point "a", the spring 17d is stretched by an increasing amount. Thus, as the joint 17c moves from point "b" to point "a", the spring 17d exerts a force on the joint 17c which increases monotonically. However, in accordance with one feature of the pressing mechanism 17, the force which squeezes the subassemblies 12–14 together does not monotonically increase as the joint 17c moves from point "b" to point "a". Instead, that force initially increases and then decreases; and the reason for this will now be described in conjunction with the equations of FIGS. 14A and 14B.

Equation 21 of FIG. 14A gives an expression for the spring constant k of the spring 17d. That expression says that the spring constant k is equal to one force Fxa minus another force Fxb, divided by a distance $\Delta x$. Here, Fxa is the force which is exerted by spring 17d on joint 17c when that joint is located at point "a"; and Fxb is the force which is exerted by spring 17d on joint 17c when that joint if, located at point "b". The distance $\Delta x$ is the distance between point "b" and point "a" in the horizontal direction, and that is the added amount by which the spring 17d is stretched in moving from point "b" to point "a".

An expression for the distance $\Delta x$ is given by equation 22. There, the terms L1, Da, and Db are terms which are described above and shown in FIG. 13. Equation 22 is obtained from the geometries in FIG. 13. Then, equation 23 is obtained by substituting equation 22 into equation 21.

Next, by equation 24 thru equation 38, the two force terms Fxa and Fxb in equation 23 will be translated into corresponding orthogonal forces F2ya and F2yb; and, the end result is given by equation 39. Force F2 is exerted by arm 17b, along its longitudinal axis, on joints 17c and 17f. Arm 17b is in tension, and thus force F2 occurs in the direction shown in FIG. 13.

Force F2ya is the vertical component of the force F2 when joint 17c is at point "a", and force F2yb is the vertical component of force F2 when joint 17c is at point "b". These vertical forces F2ya and F2yb are exerted by the joint 17f on the base member 17g which in turn squeezes the subassemblies 12–14 together.

To begin the above translation, the force F2 is partitioned into two components, F2x and F2y which respectively are parallel to the X and Y axis. Equation 24 says that the force F2x is equal to the force F2 times the sine of the angle E. Likewise, equation 25 states that the force F2y is equal to the force F2 times the cosine of the angle E. These equations 24 and 25 are obtained from the geometries of arm 17b in FIG. 13.

By dividing equation 24 with equation 25, equation 26 is obtained. In that division, the force F2 in the numerator cancels with the force F2 in the denominator. Then, equation 26 can be re-written as equation 27 which says that the force F2x is equal to the force F2y times the tangent of the angle E; and this equation 27 will be used subsequently in equation 35.

Next, by equation 28, the forces which are exerted on the pivotal joint 17c are summed in the vertical direction Y. Arm 17a exerts a force F1 on joint 17c which occurs along its logitudinal axis and has a vertical component F1y. Arms 17a is in compression, and thus the force F1 occurs in the direction shown in FIG. 13. Similarly, arm 17b exerts the force F2 on joint 17c which has vertical component F2y. By substituting the terms F1y and F2y into equation 28, equation 29 is obtained; and equation 29 will be used subsequently in equation 33.

Next, the force F1 is partitioned into two components F1x and F1y which respectively are parallel to the X and Y axis. Equation 30 says that the force F1x equals the forcet F1 times the sine of the angle D. Likewise, equation 31 says that the force F1y is equal to the force F1 times the cosine of the angle D. These equations 30 and 31 are obtained from the geometries of arm 17a in FIG. 13.

By dividing equation 30 with equation 31, equation 32 is obtained. In that division, the force F1 in the numerator cancels with the force F1 in the denominator. Then, equation 32 can be rewritten as equation 33.

However, the force F1y in equation 33 is related to the force F2y by equation 29. Thus, when equation 29 is substituted into equation 33, the result of equation 34 is obtained; and equation 34 will be used subsequently in equation 35.

Next, by equation 35, the forces which occur on the pivotal joint 17c are summed in the horizontal direction x. Equation 35 says that the force Fx is equal to the force F1x minus the force F2x. Here, Fx is the force which is exerted by the spring 17d on the joint 17c; F1x is the horizontal component of the force which occurs along the longitudinal axis in the arm 17a; and F2x is the horizontal component of the force which occurs along the longitudinal axis of the arm 17b.

An expression for the force F1x is given by equation 34, and an expression for the force F2x is given by equation 27. Thus, substituting equations 34 and 27 into equation 35 yields equation 36.

Utilizing equation 36, two other equations 37 and 38 are obtained. Equation 37 is the same as equation 36 except that it applies only to the specific case where the pivotal joint 17c is at point "a". Similarly, equation 38 is the same as equation 36 except that it applies only to the specific case where the pivotal joint 17c is at point "b".

Next, equation 39 is obtained by substituting the two equations 37 and 38 into equation 23. In equation 39, an expression is given for the spring constant K of the spring 17d; and in that expression, the only force terms which occur are the forces F2ya and F2yb. Force F2ya exerted by joint 17f against the subassemblies 12–14 when joint 17c is at point "a"; and force F2yb is exerted by joint 17f against the subassemblies 12–14 when joint 17c is at point "b".

Next, by equation 40, both of the forces F2ya and F2yb are set. equal to a predetermined force of F2y(MIN). That force F2y(MIN) is the minimum force with which the subassemblies 12–14 should be squeezed by each joint 17f in order to ensure that a proper electrical connection is made between the mating contacts 12d and 13b. Then, substituting equation 40 into equation 39 yields equation 41.

By selecting the spring constant K for the spring 17d in accordance with equation 41, the result of F2ya and F2yb being equal to F2y(MIN) will be achieved. This means that with the pressing mechanism 17 of FIG. 12, each joint 17f will press the subassemblies 12–14 together with the same force F2y(MIN) when the angle between the arms i7a and 17b is either Ca or Cb as shown in FIG. 13. And, this result occurs even though the spring 17d is stretched by two different amounts at the angles Ca and Cb.

Equation 41 can be used to construct the pressing mechanism 17 by performing a series of steps S11–S17 which are listed in FIG. 15. Initially, in step S11, the force F2y(MIN) in equation 41 is selected as one design constraint, and the distance $\Delta y$ as shown in FIG. 13 is selected as another design constraint.

Here, the force F2y(MIN) is selected based on the minimum force, with which the mating electrical contacts 12d and 13b need to be pressed together. An example of this step was previously given in conjunction with FIG. 6 wherein the force Fy(MIN) was set equal to 60 pounds.

Likewise, the distance Δy is chosen based on the selectable variations which can occur in the length of the stop 14d, and based on the manufacturing tolerances of the components 11e, 11f, 13b, 12d, 12a, and 14a. An example of this step was also previously given in conjunction with FIG. 6 wherein Δy was set equal to 0.20 inches.

Next, step S12 of FIG. 15 is performed. There, the angles Ea and Da are selected such that the force Fxa which is exerted by the spring 17d on joint 17c at point "a" is less than the force F2ya which is exerted by the joint 17f against the subassemblies 12–14. By meeting the constraint of Fxa being less than F2ya, the subassemblies 12–14 are squeezed together at point "a" with a mechanical advantage which is equal to F2ya divided by Fxa. To choose the angles Ea and Da such that the force Fxa is less than the force F2ya, equation 37 is used. That equation indicates that the force Fxa will be less than the force F2ya as long as the tangent of the angle Ea minus the tangent of the angle Da is less than one.

Next, step S13 of FIG. 15 is performed whereby the length L1 of arm 17a is selected and the length L2 of arm 17b is selected. In selecting these lengths, one constraint to meet is that arm 17a must be long enough to couple joint 17e to one of the frame columns 11c–11f, and arm 17b must be long enough to couple joint 17f to the vertically moveable base member 17g.

By performing the above steps S11, S12, and S13, the following parameters in FIG. 13 are established: 1) the location of point "a", 2) the length of the arms 17a and 17b which extend from point "a"; and 3) the respective angles Da and Ea at which those arms extend from point "a". Thus, the angle by which arm 17a must pivot on joint 17e in the counter clockwise direction in order for the joint 17f to move upward by the distance Δy can be calculated. That angle as shown in FIG. 13 is the angle Da minus the angle Db; and it is calculated in step S14 from the geometries in FIG. 13.

If the length L1 of arm 17a is selected to be too short in step S13, then it may not be possible to move joint 17c by the distance Δy. Likewise, if the angle Da is selected to be too small in step S12, then it may not be possible to move joint 17c by the distance Δy. However, these problems are overcome simply by repeating one or more of the steps S11–S13 in an interactive fashion for different arm lengths L1 and L2, and different angles Da, until joint 12f does move by the distance Δy.

Next, by step S15, the angles Db and Eb in FIG. 13 are calculated. Angle Db is simply the angle Da minus the angle which is calculated in step S14. Then, once the angle Db is determined, the angle Eb can be determined from the geometry of the arms 17a and 17b which occur when joint 17c is at point "b".

Following the above step, step S16 is performed wherein a value is calculated for the spring constant K of the spring 17d. That calculation is made by utilizing equation 41 of FIG. 14b. The right hand side of equation 41 includes all of the parameters F2y(min), Da, Db, Ea, Kb, and L1; and values for those parameters are provided by the above-described steps S11–S16.

Lastly, a calculation is made to determine the amount by which the spring 17d must be stretched when the joint 17c is at point "b". This calculation is made by step S17 in FIG. 15. There, Δx0 represents the amount by which the spring 17d is stretched; and, it is determined from the equation of Fxb=KΔx0. In that equation the only unknown is Δx0 since a value for the force Fxb can be obtained from equation 38, and a value for the spring constant K was calculated in step S16.

A numerical example of the above steps S11–S17 is shown in FIG. 16. There, by step S11, the minimum force F2y(min) is set equal to 60 pounds and the distance Δy is set equal to 0.20 inches. Next, by step S12, the angles Da and Ea are set equal to 29° and 2.722° respectively. Then, by step S13, the arm lengths L1 and L2 are selected to be 3 inches and 4 inches respectively. Due to these selections, the horizontal offset between joint 17e and joint 17f is 1.268 inches.

Next, by step S14, the angle of Da minus Db is calculated. That angle is the amount by which arm 17a must rotate in the counter-clockwise direction in order for joint 17f to move upward by the distance Δy. In step S14, the angle of Da minus Db is calculated to be 9.077°. Then, by step S15, the angles of Db and Eb are calculated to be 20° and −3.468° respectively. Here, the negative angle indicates that point "b" in FIG. 13 lies to the left of joint 17f.

Next, step S16 is performed wherein the spring constant K for the spring 17d is calculated. This calculation is made by substituting the above values for the parameters F2y (min), Da, Db, Ea, Eb, and L1 into equation 41. By that calculation, the spring constant K is set equal to 11.66 pounds per inch. Then, step S17 calculates the amount by which spring 17d must be stretched when joint 17c is at point "b". By step S17, Δx0 is determined to be 2.184 inches.

When them pressing mechanism 17 has the parameters that are given in FIG. 16, the forces Fx and F2y which occur, for various positions of the arms, are listed in FIG. 17. There the units for the angles D and E is degrees, and the units for the forces Fx and F2y is pounds. Inspection of FIG. 17 shows that at each of the angles Da and Db, the force F2y which is exerted by the joint 17f equals the desired minimum force of 60 pounds. This occurs even though the force Fx which is exerted by the spring 17d at the angle Da is completely different than the force Fx which is exerted by the spring at the angle Db.

Inspection of FIG. 17 also shows that as the angle D decreases from the angle Da to the angle Db, the force Fx decreases monotonically, whereas the force F2y initially increases and then decreases. This decrease in the force F2y after the initial increase is important because it reduces the maximum force with which the subassemblies 12–14 are pressed together.

Inspection of FIG. 17 further shows that as the angle D decreases from Da to Db, the mechanical advantage with which the actuator 16 moves the pivotal joint 17e monotonically increases. This mechanical advantage equals the force F2y divided by Fx. However, as the angle D decreases from Da to Db, the force Fx with which the spring 17d pulls the arms together monotonically decreases. This decrease in force Fx counteracts the increase in the mechanical advantage, and that causes the force F2y to decrease after its initial increase.

Figure 18:
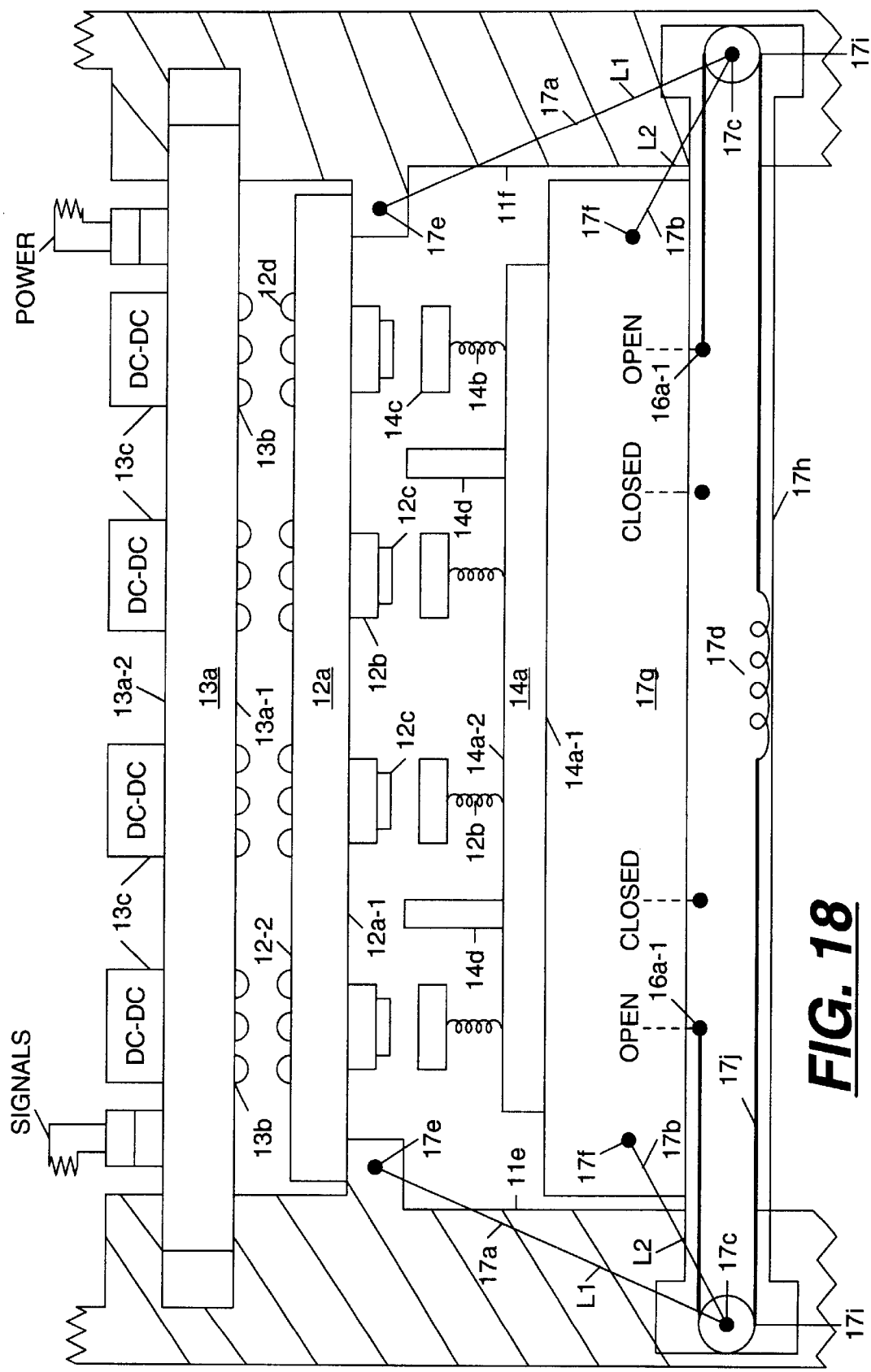
FIG. 18 shows a seventh embodiment of a pressing mechanism which has some similarity to the pressing mechanism of FIG. 12.

Referring next to FIG. 18, a seventh embodiment of the pressing mechanism will be described. This seventh embodiment includes components 17a–17j, and it is obtained by modifying the sixth embodiment of FIG. 12.

One change in the FIG. 18 pressing mechanism is that the two arms 17a and 17b extend downward and from their respective joints of 17e and 17f, rather than upward. Consequently in FIG. 18, joint 17c, which connects the two arms, is below both of the other two joints 17e and 17f; whereas in FIG. 12, joint 17c is above both of the joints 17e and 17f.

Another change in the FIG. 18 pressing mechanism occurs in the coupling between joint 17c and the actuator slots 16a-1. This is seen in FIG. 18 wherein—a) each joint 17c is connected to a pulley wheel 17i; b) a single spring 17d is located between each pair of the pulley wheels 17i; and c) the spring 17g is stretched by a cable 17j which wraps approximately halfway around the pulley wheels where it is then pulled by the actuator slots 16a-1.

All of the analysis which is provided in FIGS. 13, 14A and 14B for the embodiment of FIG. 12 can be easily modified to apply to the embodiment of FIG. 18. To do that, the forces Fxa and Fxb, which are shown in FIG. 13 as being exerted on joint 17c by the spring, become changed to the forces Fxa and Fxb which are exerted on joint 17c by the pulley wheel 17i.

Cable 17j extends from the pulley wheel 17i at its top and its bottom, and thus cable 17i exerts two forces of equal magnitude on the pulley wheel 17i. Thus, about half of the forces Fxa and Fxb that are exerted on joint 17c occur within the cable 17j. Spring 17d is stretched by the cable 17j, and so about half of the forces Fxa and Fxb are exerted by the spring 17d. Also, joint 17c moves by half the distance which cable 17i is moved by the actuator slots 16a-1. In all other respects, the analysis of FIGS. 13, 14A and 14B applies directly to the pressing mechanism of FIG. 18. Thus, equation 41 of FIG. 14B can be used to determine the spring constant k for the spring 17d. Likewise, steps S1–S17 can be used to select all of the other parameters of F2y(MIN), ΔY, Da, Ea, L1, L2, Db, Eb, and Δxo.

Next, with reference to FIG. 19, an eighth embodiment of the pressing mechanism will be described. This embodiment of FIG. 19 is the same as the previously described embodiment of FIG. 12 except that spring 17d is eliminated and replaced by a different spring 17k at a different location.

Figure 19:
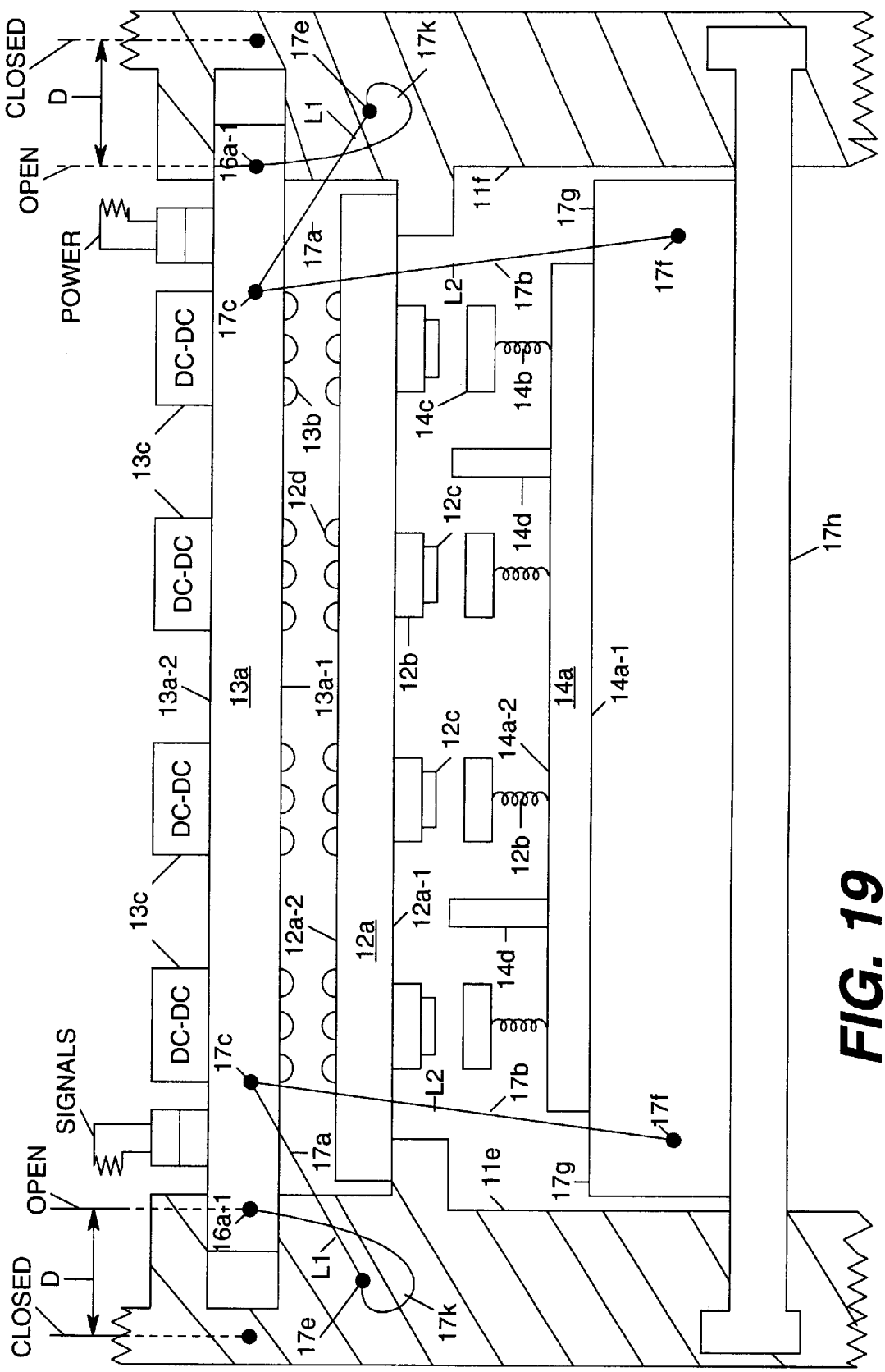
FIG. 19 shows an eighth embodiment of a pressing mechanism which has some similarity to the pressing mechanism of FIG. 12.

More specifically, in the embodiment of FIG. 19, the springr 17k is a torsion spring; and it is coupled as shown between joint 17e and slot 16a-1 of the actuator. As the actuator moves from the open position to the closed position, the amount of torque which is exerted by the spring 17k on joint 17e monotonically increases. That torque increase then causes the base 17g to move upward and squeeze the subassemblies 12–14 together.

Several preferred embodiments of the present invention have now been described in detail. In addition however, the following changes and modifications can be made to these details without departing from the nature and spirit of the invention.

To aid in the description of one modification, reference should now be made back to FIGS. 7 and 8. Those figures show an embodiment of the pressing mechanism 15 wherein the mating electrical contacts 12d and 13b are pressed together with the minimum force of Fy(min) when the angle B between the arms is at the two limits of B1 and B2 for the closed position. Having the minimum force occur at the closed position limits of B1 and B2 is desirable because it causes the maximum value of the force Fy to occur close to midway between B1 and B2; and, that tends to minimize the difference between the minimum force and the maximum force with which the subassemblies 12–14, are pressed together.

However, as an alternative, the angle B at which the maximum Fy force occurs can be shifted either towards the angle B1 or towards the angle B2. In fact, the angle B at which the maximum Fy force occurs can be shifted past the angle B1 or past the angle B2. Such shifting is achieved simply by altering the amount Δxo by which the spring 15g is compressed at the angle B1, and/or altering the spring constant K, from the preferred values which are determined by steps 33 and 35 in FIG. 6.

When the above shifting is performed, the mechanical advantage of Fy/Fx will still increase as the angle B between this arms decreases from B2 to B1; and, that increase in the mechanical advantage will still be counter-acted by a decrease in the force Fx as the angle B varies from B2 to B1. Consequently, the total amount by which the force Fy varies from angle B2 to angle B1 will still be reduced.

The above modification to the embodiment of FIG. 8 can also be incorporated into all of the other illustrated embodiments. In FIGS. 16 and 17, for example, angle D in the closed position varies from Da to Db, and at each of those angular limits, the force F2y equals the minimum force of F2y(min). Thus, the maximum value of the force F2y occurs close to midway between the angles Da and Db. However, as a modification, the angle D at which the maximum F2y force occurs can be shifted either towards angle Db, or towards angle Da, or past those angles. This shift is accomplished simply by altering the amount Δxo by which the spring 17d is stretched at position Db; and/or altering the spring constant K, from the preferred values that are determined by steps S16 and S17 in FIG. 15.

Next, to aid in the description of another modification, reference should be made to FIG. 2. There, joint 15d in the pressing mechanism 15 pushes against the temperature regulating subassembly 14 in order to press the subassemblies 12–14 together. However, when certain types of chips 12c are tested, their temperature may not need to be regulated; and so in that case, the temperature regulating subassembly 14 can be eliminated. Then, joint 15d of the pressing mechanism 15 can push directly against the chips carrying subassembly 12 in order to press together the mating electrical contact 12d and 13b. This modification can also be made to all of the other illustrated embodiments.

Next, to aid in the description of another modification, reference should again be made to FIG. 2. There, the spring 15g is shown as being attached directly to the slidable joint 15f. However, as a modification, the spring 15g can, be coupled to arm 15c at any other point. This modification also applies to all of the embodiments of FIGS. 9 through 11. Similarly, in the embodiment of FIG. 12, the spring 17d is shown as being attached directly to joint 17c. However, as a modification, the spring 17d can be coupled to arm 17a at any other point. This modification also applies to the embodiment of FIG. 18.

Next, to aid in the description of another modification, reference should again be made to FIG. 2. There, the stop 14d is shown as being attached to member 14a in the temperature regulating subassembly 14. However, as a modification, the stop 14d can be attached to member 12a of the chip holding subassembly 12. See FIG. 20. This modification can also be made to all of the other illustrated embodiments.

Next, to aid in the description of another modification, reference should be made to FIG. 1A. There, the actuator 16 is shown including an electric motor 16c which operates in response to control signals that are sent on conductors 16f. Those control signals were described as being generated by manually operated control switches (not shown); however, as a modification the control signals for the motor 16c can be generated from any other source. For example, a digital computer with a control program can generate the control signals on the conductors 16f automatically.

Next, to aid in the description of another modification, reference should be made to FIG. 2. There, a separate DC-DC power converter 13c is shown in the subassembly 12 for each chip 12c that is held in the subassembly 12. However, if the chips 12c use a relatively small amount of power, then each DC-DC converter 12c can supply power to more than one chip. Conversely, if the chips 12c use a relatively large amount of power, then two or more DC-DC power converters can supply power to each chip. Further, the power converters 13c are not limited to being DC-DC power converters; but as an alternative, they can be any circuit which converts AC power to DC power. See FIG. 20.

Figure 1B:
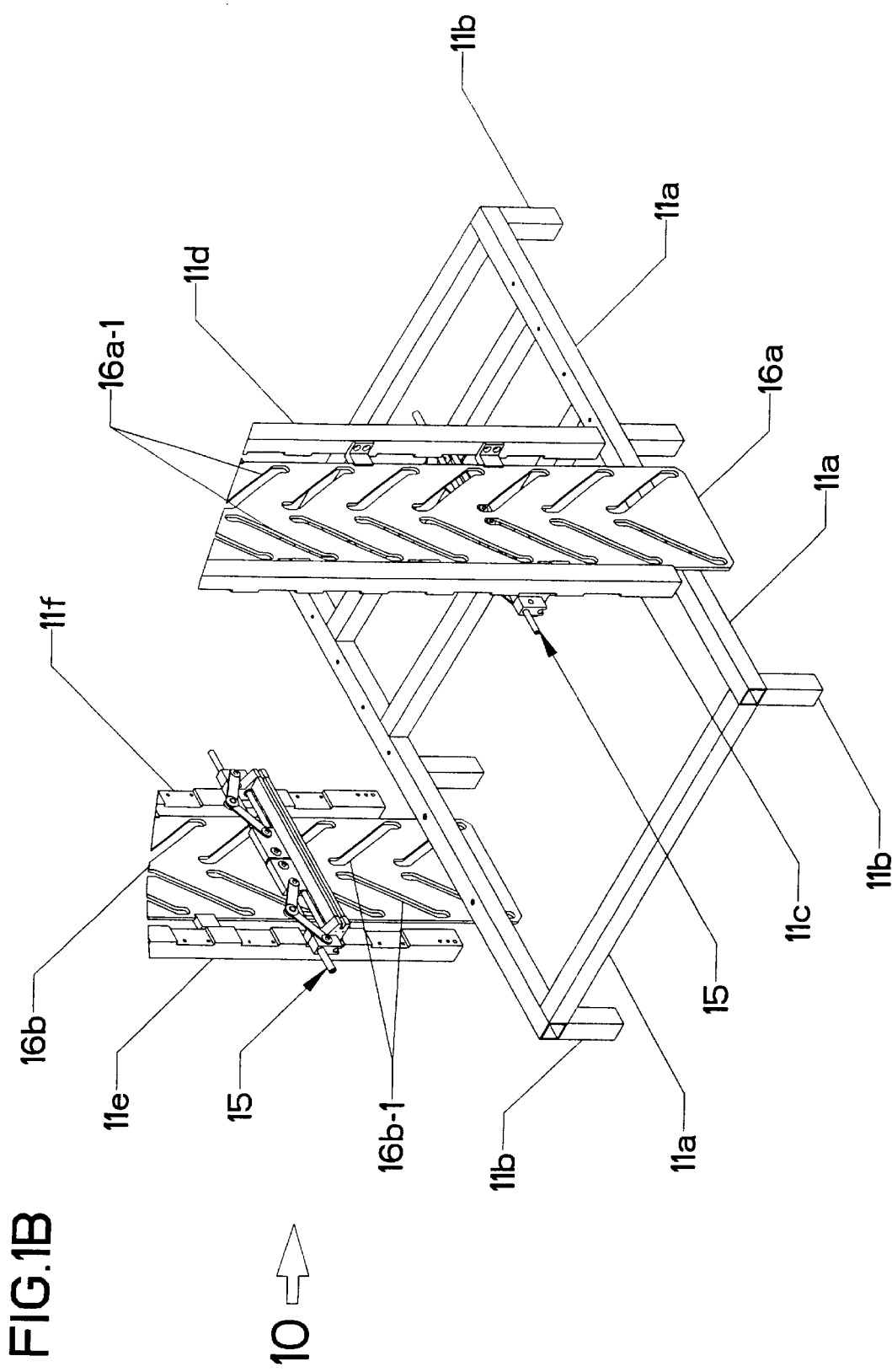
FIG. 1B shows a pictorial view of the bottom portion of the electromechanical apparatus of FIG. 1A.

Next, to aid in the description of another modification, reference should be made to FIG. 1B. That figure shows the plates 16a and 16b which move up and down, and it shows the slots 16a-1 in the plates which cause the joints 15e in the pressing mechanisms 15 to slide. In FIG. 1B, the slots 16a-1 as illustrated lie at an angle of about 45° with respect to the direction in which the joints 15e slide. However, as a modification, the angle of the slots 16a-1 can be either increased or decreased. As the angle of the slots 16a-1 is decreased with respect to the direction in which the joints 15e slide, then the force which the motor 16c must exert to move the plates 16b decreases. However, as the angle of the slots 16a-1 is decreased, the distance which the motor 16c must moose the plates 16a and 16b in order to open the contacts 12d and 13b, increases.

Next, to aid in the description of another modification, reference should be made to FIGS. 11A and 11B. FIG. 11B shows an embodiment of the pressing mechanism 15 wherein the legs 15b and 15c have different lengths of L1 and L2 respectively; and, FIG. 11A provides an equation 15' which expresses the spring constant k in terms of various parameters that are shown in FIG. 11B. Inspection of FIG. 11B shows that the two slidable joints 15e and 15f are illustrated as sliding on a single axis 15x. But as a modification, the joints 15e and 15f can slide on separate axes which are spaced apart and parallel to each other. With this modification, equation 15' of FIG. 11A cam still be used in conjunction with steps S1–S5 of FIG. 6 to calculate the spring constant k for the spring 15g.

Next, to aid in the description of another modification, reference should be made to FIGS. 1C and 2. Those figures illustrate the mating electrical contacts 12d and 13b which are pressed together by any one of the pressing mechanisms in FIGS. 2–19. The contacts 12d and 13b can be any type of pressed electrical contacts that are commercially available. For example, each contact 13b can be a springy contact such as a "fuzz-button", and each contact 12d can be a non-springy metal pad for a corresponding fuzz-button. Alternatively, each contact 12d can be the springy contact, and each contact 13b can be the non-springy metal pad. See FIG. 20.

Also, the planar members 12a and 13a on which the mating electrical contacts 12d and 13b are mounted are not limited to being a printed circuit board. Instead, the planar members 12a and 13a can be made of any electrical insulator such as a ceramic or a plastic or epoxy glass; and the electrical conductors which carry signals to and from the contacts 12d and 13b can be printed conductors that are integrated into the planar members 12a and 13a, or separate wires that are attached to the planar members.

Preferably, each of the electrical contacts 12d and 13b have a contact resistance which is so small that a negligible IR drop occurs through the contacts. Having such a low contact resistance is especially important for the contacts which carry electrical power to the chips; and, this is because certain high power chips can draw a large amount of current, such as 50 amps. To decrease the resistance of a contact 12d or 13b, the area which the contact occupies on the face of the substrates 12a and 13a should be increased. A large amount of room is available on the substrates 12a and 13a to increase the contact areas, as desired, and this is seen from FIGS. 1C and 2.

Next, to aid in the description of another modification, reference should be made to FIG. 6. There, in step S5, the amount $\Delta$xo by which the spring 15g is compressed (or stretched) at the angle B1 is determined from the equation $Fx(B1) = k\Delta xo$. However, as a modification, the spring 15g can be constructed with a "preload" such that an initial force of Fo must be exerted on the spring in order to start to compress it (or stretch it). In that case, step S5 is modified such that $\Delta$xo is determined from the equation $Fx(B1) - Fo = k\Delta xo$. Likewise, this same modification can be incorporated into step S17 of FIG. 15.

Next, to aid in the description of another modification, reference should be made to FIGS. 1A and 1B. There, the subassemblies 12–15 are shown as being held in a vertical stack by the frame 11. However, as a modification, the frame 11 of FIGS. 1A and 1B can be tipped over by ninety degrees. With this modification, the subassemblies 12–15 are held by the frame in a horizontal row.

Next, to aid in the description of another modification, reference should be made to FIG. 2. There, the power converter subassembly 13 is shown as being held stationary in the frame 11, and the chip holding subassembly 12 as well as the temperature regulating subassembly 14 are shown as being moved by the pressing mechanism 15. However, as a modification, all of the subassemblies 12–14 in FIG. 2 can be rotated 180 degrees in the plane of the figure. With this modification, the pressing mechanism 15 pushes against and moves the power converter subassembly 13, and the temperature regulating subassembly 14 is held stationary by the frame 11. This modification can also be made in combination with the previously described modification where the temperature regulating subassembly 14 was eliminated. In that case, the pressing mechanism 15 would push against and move the power converter subassembly 13, and the chip holding subassembly 12 would be held stationary by the frame 11.

Next, to aid in the description of another modification, reference should be made to FIG. 2. There, joint 15d in the pressing mechanism 15 pushes against the temperature regulating subassembly 14 in order to press the subassemblies 12–14 together. However, the pressing mechanism 15 can be used to push the temperature regulating subassembly 14 against the chip holding subassembly 12 even if power is supplied to the chips in a conventional fashion through an edge connector on the chip holding board 12a. In that case, the power converter subassembly would be eliminated. This modification also can be made to all of the other illustrated embodiments.

Accordingly, in view of the above modifications, it is to be understood that the present invention is not limited to the details of any one of the illustrated preferred embodiments, but is defined by the appended claims.

What is claimed is:

1. A subassembly of an electromechanical apparatus for testing integrated circuit chips; said subassembly being comprised of:

first and second planar printed circuit boards, with each printed circuit board having first and second faces that are opposite to each other and are surrounded by an edge that is free of any electrical edge connectors;

a plurality of sockets, which are physically located on said first face of said printed circuit board, for holding said integrated circuit chips;

a first plurality of electrical contacts, which are physically located on said second face of said first printed circuit board and are connected through said first printed circuit board to said sockets, for carrying all electrical power and all electrical signals for said integrated circuit chips;

a plurality of electrical power converters and a signal connector, which are physically located on said first face of said second printed circuit board;

a second plurality of electrical contacts, which are physically located on said second face of said second printed circuit board and are connected through said second printed circuit board to said electrical power converters and said signal connector, for making pressed connections with said first plurality of electrical contacts; and, a means for pressing said first and second printed circuit boards together such that said first and second plurality of electrical contacts make said pressed connections and power for said chips only travels from said electrical power converters on said second printed circuit board through said pressed connections to said sockets on said first printed circuit board.

2. A subassembly according to claim 1 wherein said power converters change DC power at one voltage to DC power at another voltage.

3. A subassembly according to claim 1 wherein said power converters change AC power to DC power.

4. A subassembly according to claim 1 wherein a plurality of spacers are also attached to said first face of said first printed circuit board between said sockets.

5. A subassembly according to claim 4 wherein said spacers are attached to said first face of said first printed circuit board in a removable fashion and have several selectable lengths.

6. A subassembly according to claim 1 wherein said first printed circuit board is an epoxy glass printed circuit board.

7. A subassembly according to claim 1 wherein said second printed circuit board is an epoxy glass printed circuit board.

8. A subassembly according to claim 1 wherein said first plurality of electrical contacts are springy contacts and said second plurality of electrical contacts are non-springy metal pads.

9. A subassembly according to claim 1 wherein said first plurality of electrical contacts are non-springy metal pads and said second plurality of electrical contacts are springy contacts.

* * * * *